(12) United States Patent
Liu et al.

(10) Patent No.: US 7,887,996 B2
(45) Date of Patent: Feb. 15, 2011

(54) METHOD OF PATTERN TRANSFER

(75) Inventors: Hung-Jen Liu, Taipei County (TW);
Cheng-Ku Chiang, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 713 days.

(21) Appl. No.: 11/936,026

(22) Filed: Nov. 6, 2007

(65) Prior Publication Data

US 2008/0241734 A1 Oct. 2, 2008

(30) Foreign Application Priority Data

Mar. 30, 2007 (TW) .............................. 96111477 A

(51) Int. Cl.
*G03F 7/00* (2006.01)
*G03F 7/20* (2006.01)
*G03F 7/26* (2006.01)
*G03F 7/40* (2006.01)

(52) U.S. Cl. ................ 430/312; 430/270.1; 430/273.1; 430/317; 430/322; 430/330; 430/331; 430/394; 430/396

(58) Field of Classification Search .............. 430/270.1, 430/273.1, 312, 330, 331, 317, 322, 394, 430/396
See application file for complete search history.

(56) References Cited

U.S. PATENT DOCUMENTS

| | | | | |
|---|---|---|---|---|
| 5,686,223 | A * | 11/1997 | Cleeves | 430/312 |
| 6,664,011 | B2 * | 12/2003 | Lin et al. | 430/5 |
| 7,235,348 | B2 * | 6/2007 | Ho et al. | 430/312 |
| 7,582,413 | B2 * | 9/2009 | Chen | 430/322 |
| 7,666,578 | B2 * | 2/2010 | Fischer et al. | 430/314 |
| 2005/0100799 | A1 | 5/2005 | Hagiwara | |
| 2005/0170294 | A1 | 8/2005 | Kobayashi | |
| 2005/0255411 | A1 * | 11/2005 | Frost et al. | 430/312 |
| 2006/0216649 | A1 * | 9/2006 | Paxton et al. | 430/311 |
| 2008/0305642 | A1 * | 12/2008 | Lee et al. | 438/703 |
| 2009/0194840 | A1 * | 8/2009 | Noelscher et al. | 257/499 |

FOREIGN PATENT DOCUMENTS

| | | |
|---|---|---|
| CN | 1607649 A | 4/2005 |
| TW | 413845 | 12/2000 |
| TW | I249789 | 2/2006 |
| TW | I250376 | 3/2006 |
| TW | 200612473 | 4/2006 |

* cited by examiner

*Primary Examiner*—Amanda C. Walke
(74) *Attorney, Agent, or Firm*—Winston Hsu; Scott Margo

(57) ABSTRACT

Pattern transfer is achieved by forming a first patterned hard mask layer with a circuit pattern and a plurality of dummy patterns on a substrate, forming a second pattern mask layer on the substrate, exposing the circuit pattern of the first pattern mask layer, and removing a portion of the substrate exposed by the first patterned mask layer, so as to transfer the circuit pattern to the substrate.

20 Claims, 37 Drawing Sheets

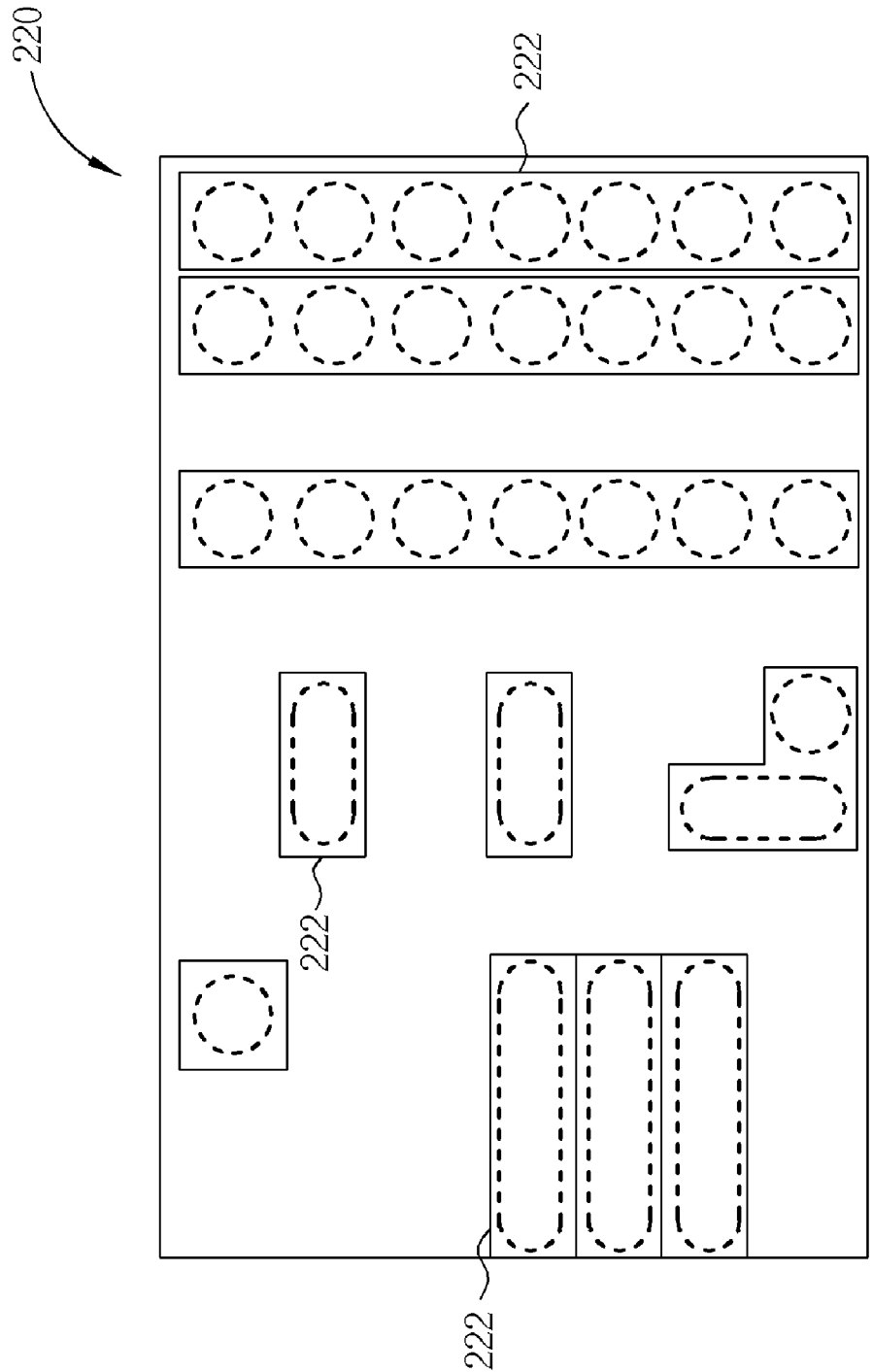

METHOD OF PATTERN TRANSFER

BACKGROUND OF THE INVENTION

1. Field of the Invention

The present invention relates to a method to transfer a circuit pattern to a substrate, and more particularly to a method which transfers the circuit pattern to the substrate by two patterns different from the circuit pattern.

2. Description of the Prior Art

In semiconductor manufacturing processes, in order to transfer an integrated circuit layout onto a semiconductor wafer, the integrated circuit layout is first designed and formed as a lithography pattern. Then, the lithography pattern is transferred to form a photo mask pattern. The photo mask pattern is then proportionally transferred to a photoresist layer positioned on the semiconductor wafer.

As a design pattern of an integrated circuit becomes smaller, for example, a critical dimension becomes smaller than 90 nm, and due to a resolution limit of an optical exposure tool, an optical proximity effect occurs during the photolithographic process performed for transferring the photo mask pattern with high density. The optical proximity effect causes defects, such as residue of an assistant feature next to a right-angle main feature, right-angle corner rounding, line end shortening, and line width increasing/decreasing to the photo mask pattern during transferring.

Contact/via hole patterns having small dimensions have the strictest pattern transfer requirements among all circuit patterns. In addition, when spaces between two adjacent element patterns are different, and the element patterns, comprising both dense patterns and iso patterns, are disposed randomly, the process window of the lithography process is decreased.

To avoid the above-mentioned problems caused by the optical proximity effect, resolution enhancement technology (RET) and optical proximity effect correction (OPC) are developed. RET technologies used widely in the semiconductor industry include: sub-resolution assist feature (SRAF), off-axis illumination, and phase shift mask. However, the above-mentioned methods require complicated simulations, and changes in light source, photoresist, and equipment. Moreover, when the patterns are disposed randomly, RET becomes complicated due to the deviation between the dense patterns and the iso patterns, and pattern transfer defects will occur.

SUMMARY OF THE INVENTION

It is therefore a primary objective of the present invention to provide a method of pattern transfer. The method of pattern transfer disclosed in the present invention solves the above-mentioned problems by defining predetermined patterns on the same material by using two different hard mask layers which have different patterns.

According to the pattern transfer method of the present invention, first, a substrate is provided. Then, a first patterned hard mask layer is formed on the substrate. The first patterned hard mask layer comprises a circuit pattern and a plurality of dummy patterns. Next, a second patterned hard mask layer is formed on the substrate. The second patterned hard mask layer exposes the circuit pattern on the first patterned hard mask layer. Following that, the exposed substrate is removed partially by using the first patterned hard mask layer as a mask, so that the circuit pattern is transferred to the substrate.

In the present invention, the first lithography pattern comprises the circuit pattern and dummy patterns. By disposing the dummy patterns between the circuit patterns, which is positioned randomly, equal space in the lithography pattern can be obtained, and the process window can be improved, so that a better resolution of the first pattern transfer can be obtained as well. Therefore, the deviation caused by the optical proximity effect is reduced. Thus, RET needs not be performed to correct the lithography pattern. After that, a region of the circuit pattern is defined by transferring the second lithography pattern using the second pattern transfer process. Therefore, a circuit pattern having high resolution and low defects can be formed on the hard mask layer. As a result, the method disclosed in the present invention simplifies the fabricating process and provides a transferred pattern with high resolution.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 35 to FIG. 37 are schematic views of a fabricating process of a fifth embodiment in the present invention.

DETAILED DESCRIPTION

Figure 1:
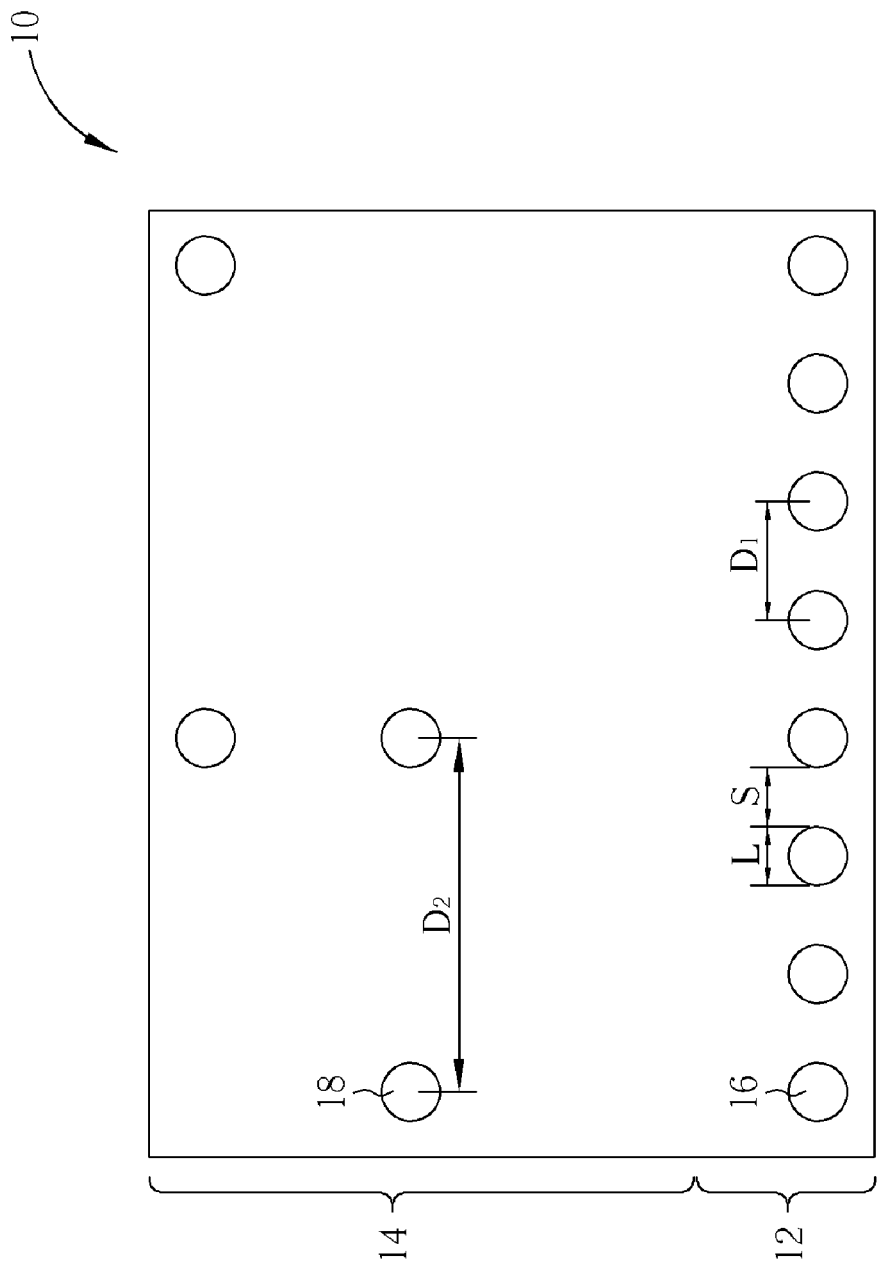
FIG. 1 to FIG. 18 are schematic views of a fabricating process of a first embodiment in the present invention.

The pattern transfer method disclosed in the present invention can be applied to a lithography process for semiconductor fabrication, and is especially suitable for the semiconductor elements of critical dimension below 90 nm. With reference to the FIG. 1 to FIG. 18, which show schematic views of the fabricating process of a first embodiment of the present invention. In the first embodiment of the present invention, a circuit pattern 10 shown in FIG. 1 will be transferred to a substrate 52 (shown in FIG. 2), wherein the substrate 52 is positioned on the surface of a wafer 50. The material of the substrate 52 comprises, for example, but is not limited to, a semiconductor, a dielectric layer, a metal layer, and an insulation layer. The circuit pattern 10 comprises a dense pattern region 12 and an iso pattern region 14. The dense pattern region 12 comprises a plurality of dense patterns 16 which are positioned in a row, and an equal pitch D1 (including a width L and a space S) is defined between two adjacent patterns. The iso pattern region 14 comprises a plurality of iso patterns 18 which are disposed randomly in the iso pattern region 14, and each of the iso patterns 18 comprises at least a pitch $D_2$, which is longer than that of the pitch $D_1$ of the dense pattern 16. In this embodiment, the width L and the space S of the dense patterns 16 are approximately equal. In addition, the dense patterns 16 and the iso patterns 18 are patterns of contact holes having substantially identical shape and size.

Figure 2:
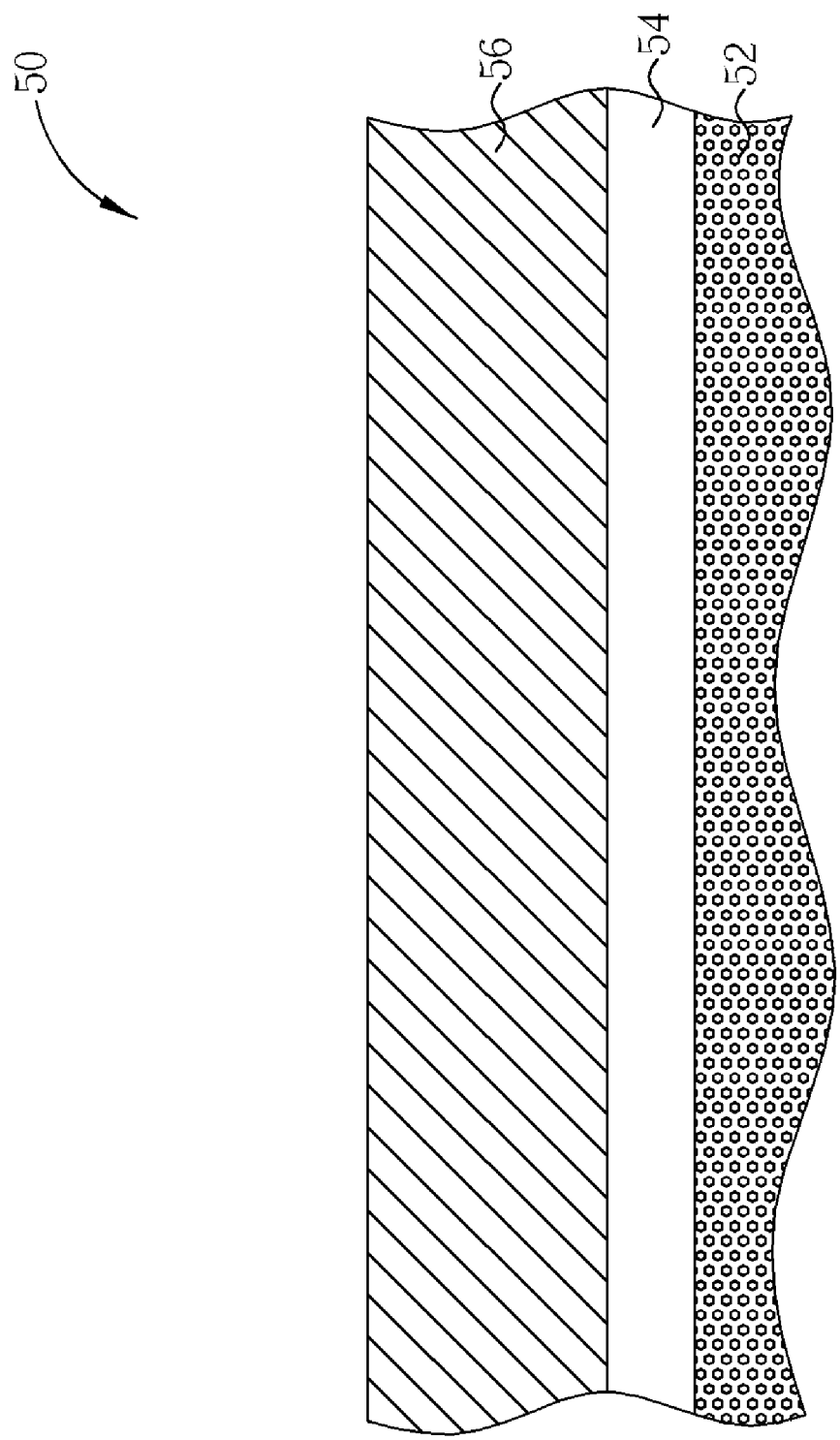

Please refer to FIG. 2, a hard mask layer 54 and a first photoresist layer 56 are formed on the surface of the substrate 52 in sequence. The material of the hard mask layer 54 can be decided based on the material of the substrate 52. Generally speaking, the material of the hard mask layer 54 includes a nitride layer and an oxide layer. In addition, the first photoresist layer can be a positive photoresist or a negative photoresist. However, the positive photoresist is preferably applied for the method of the present invention.

Figure 3:
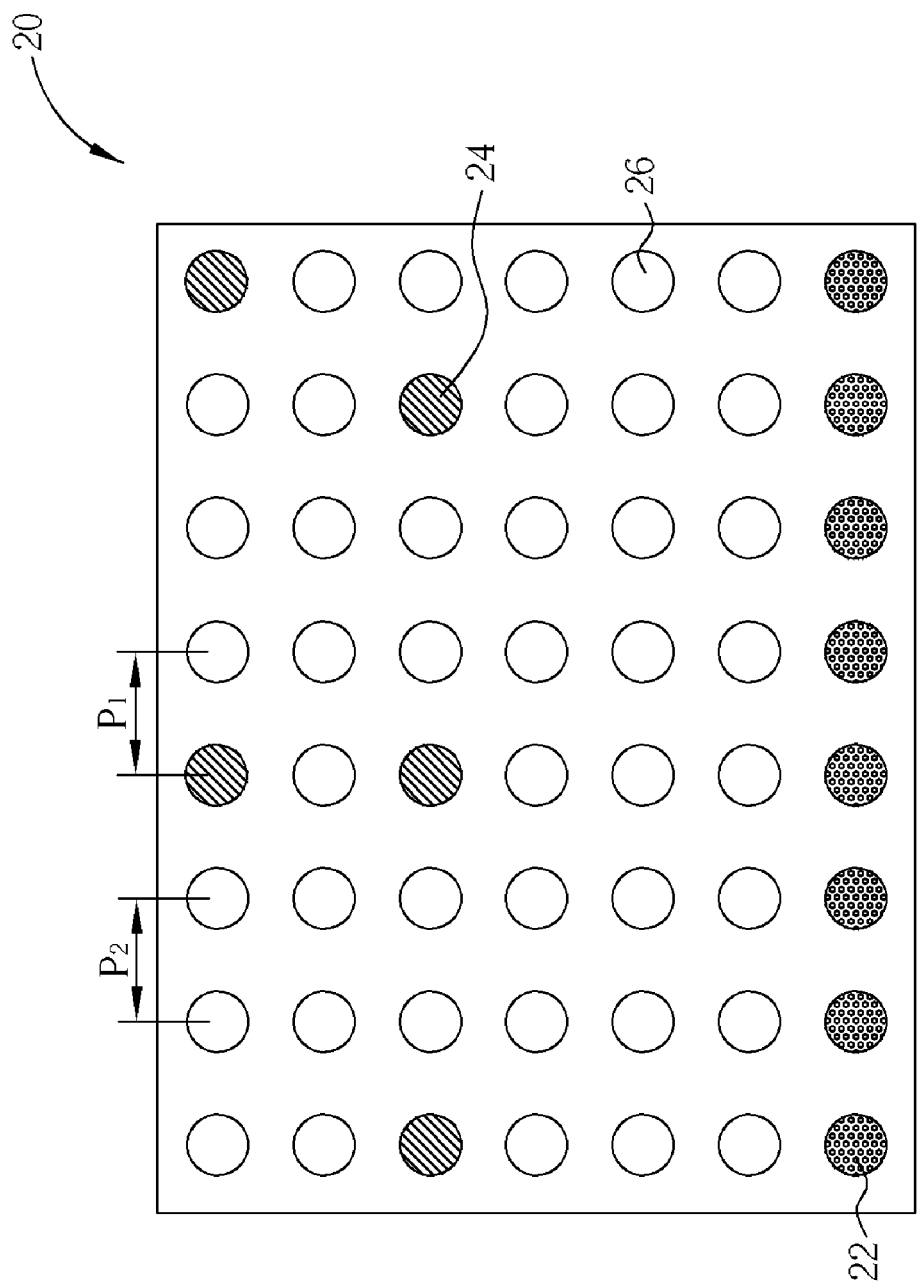

Next, as shown in FIG. 3, a first lithography pattern 20 is provided in order to perform a first pattern transfer process. The first lithography pattern 20 comprises all patterns on the circuit pattern 10, e.g. a plurality of the dense lithography patterns 22 (indicated by dots) corresponding to the dense patterns 16 of the circuit pattern 10 (as shown in FIG. 1), and iso lithography patterns 24 (indicated by oblique lines) corresponding to the iso patterns 18 of the circuit pattern 10 (as shown in FIG. 1). In addition, the first lithography pattern 20 further comprises a plurality of dummy patterns 26 (indicated by blank circles) positioned between the dense lithography patterns 22 and the iso lithography patterns 24. The pitch $P_1$ between two mutually adjacent dummy pattern 26 and iso lithography pattern 24, and the pitch $P_2$ between two adjacent dummy patterns 26 are equal to the pitch $D_1$ between two adjacent dense patterns 16 of the circuit 10. Therefore, the dense lithography patterns 22, the iso lithography patterns 24, and the dummy patterns 26 form an array pattern, which has an equal pitch between every two adjacent patterns.

Figure 4:
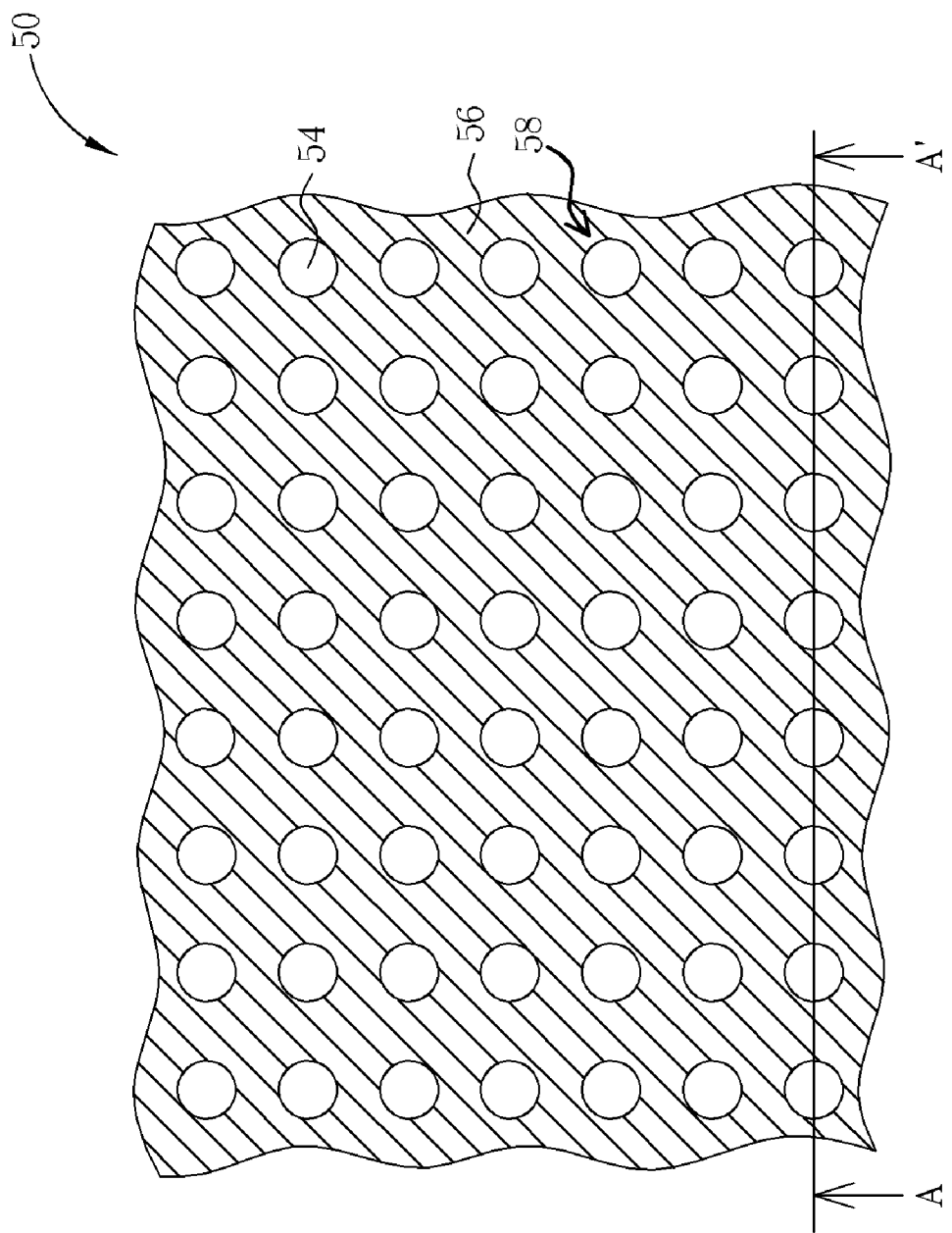
Figure 5:
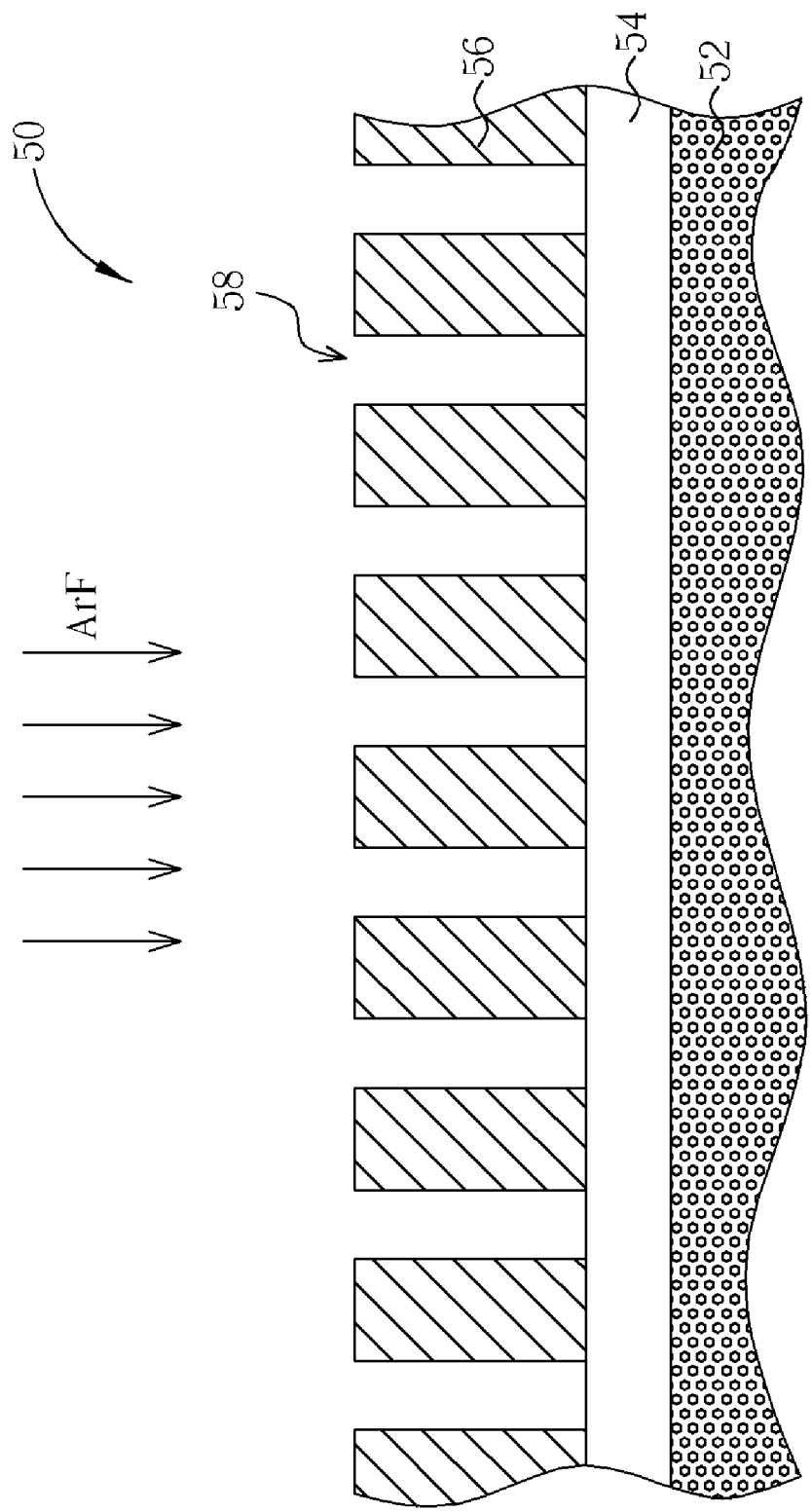

With reference to FIG. 4 and FIG. 5, wherein FIG. 4 is a top view of the wafer 50 and FIG. 5 is a cross section of the wafer 50 in FIG. 4 along AA'. A first pattern transfer process is performed. A first lithography pattern 20 is formed on a photo mask, which is used to perform a lithography process to transfer the first lithography pattern 20 to the first photoresist layer 56. Then a development process is performed to form a plurality of contact holes 58 on the first photoresist layer 56. Because the first lithography pattern 20 has dense pitches, in order to provide a better pattern transfer, Argon Fluoride (ArF), which has a wavelength of 198 nm, is preferably used as a light source for the first pattern transfer process. In addition, because ArF is used as the light source, the first photoresist layer 56 is preferably ArF photoresist, e.g. alicyclic acrylate polymer.

Figure 6:
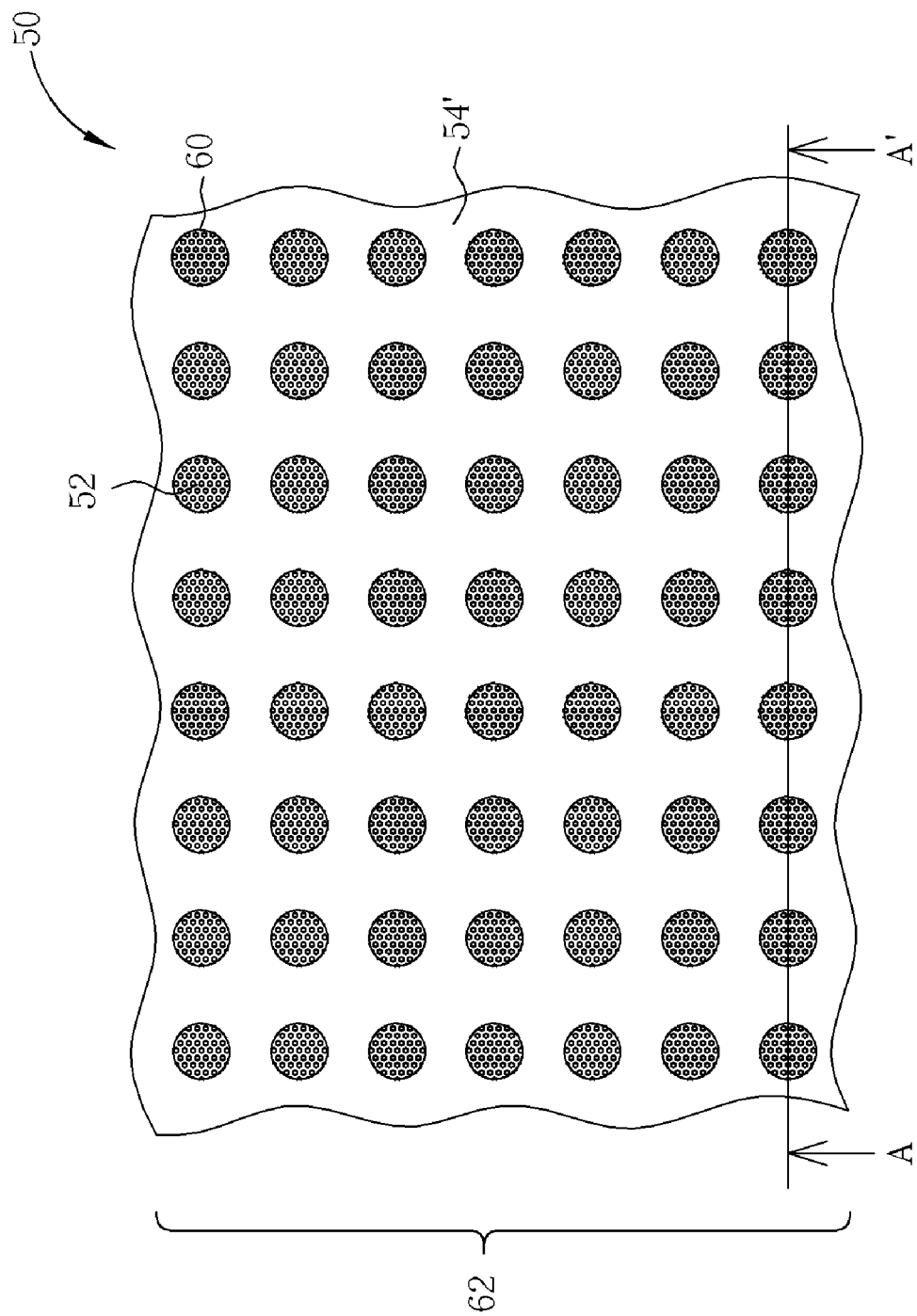
Figure 7:
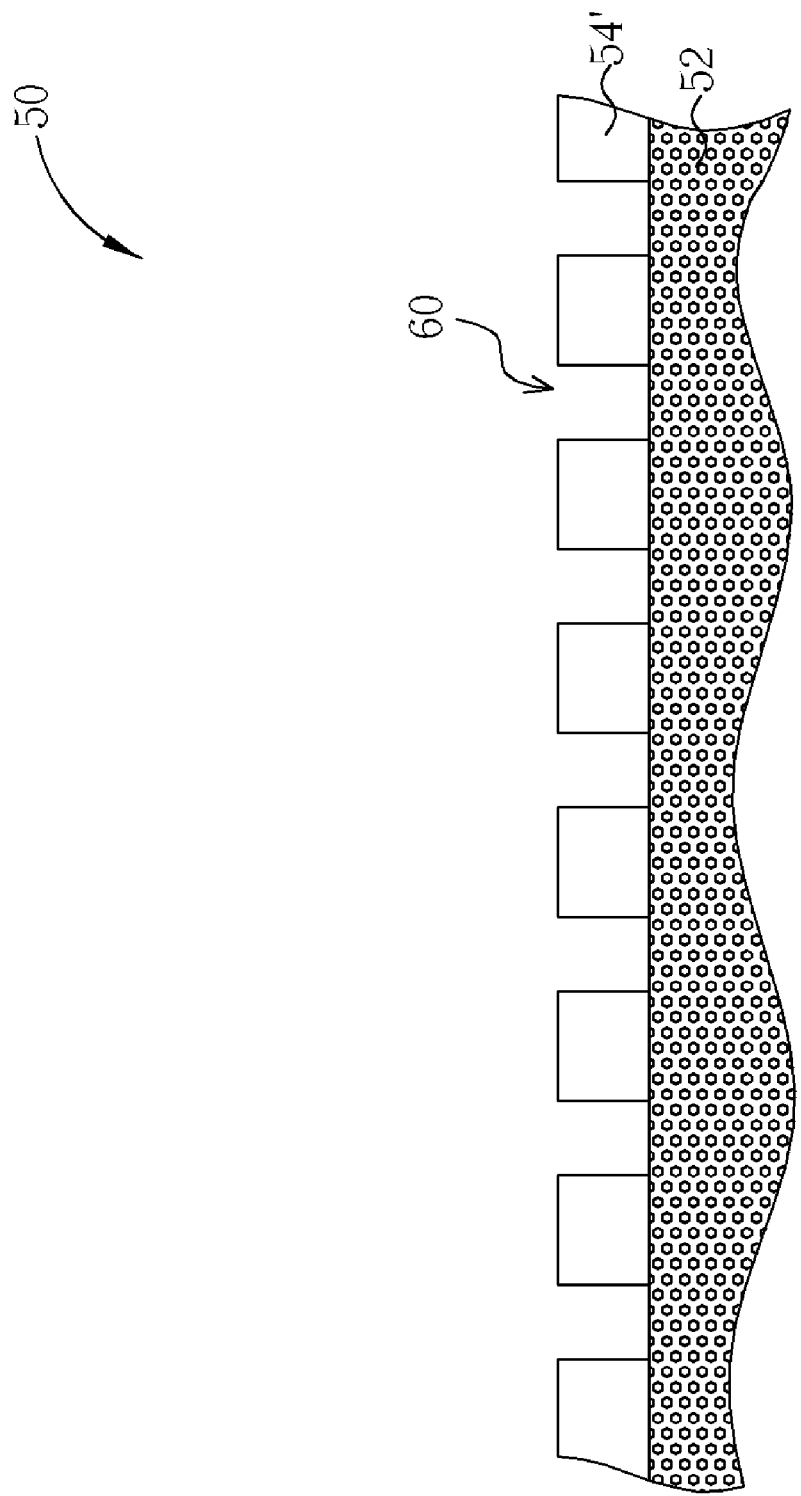

With reference to FIG. 6 to FIG. 7, wherein FIG. 7 is a cross section of the wafer 50 in FIG. 6 along line AA'. Next, the first photoresist layer 56 (as shown in FIG. 5) is utilized as a hard mask to etch the hard mask layer 54. After that, the patterns of contact holes on the first photoresist layer 56 are transferred to the hard mask layer 54, and a plurality of patterns of the contact holes 60 disposed in an array 62 are formed on the hard mask layer 54. Each pattern of the contact holes 60 exposes the substrate 52, so that the hard mask layer 54 becomes a first patterned hard mask layer 54'.

The array 62 comprises patterns of the contact holes 60 corresponding to the dense patterns 16 and the iso patterns 18 of the circuit pattern 10, as shown in FIG. 1, and patterns of the contact holes 60 are defined by the dense lithography patterns 22 and the iso lithography patterns 24, respectively, as shown in FIG. 3.

Figure 8:
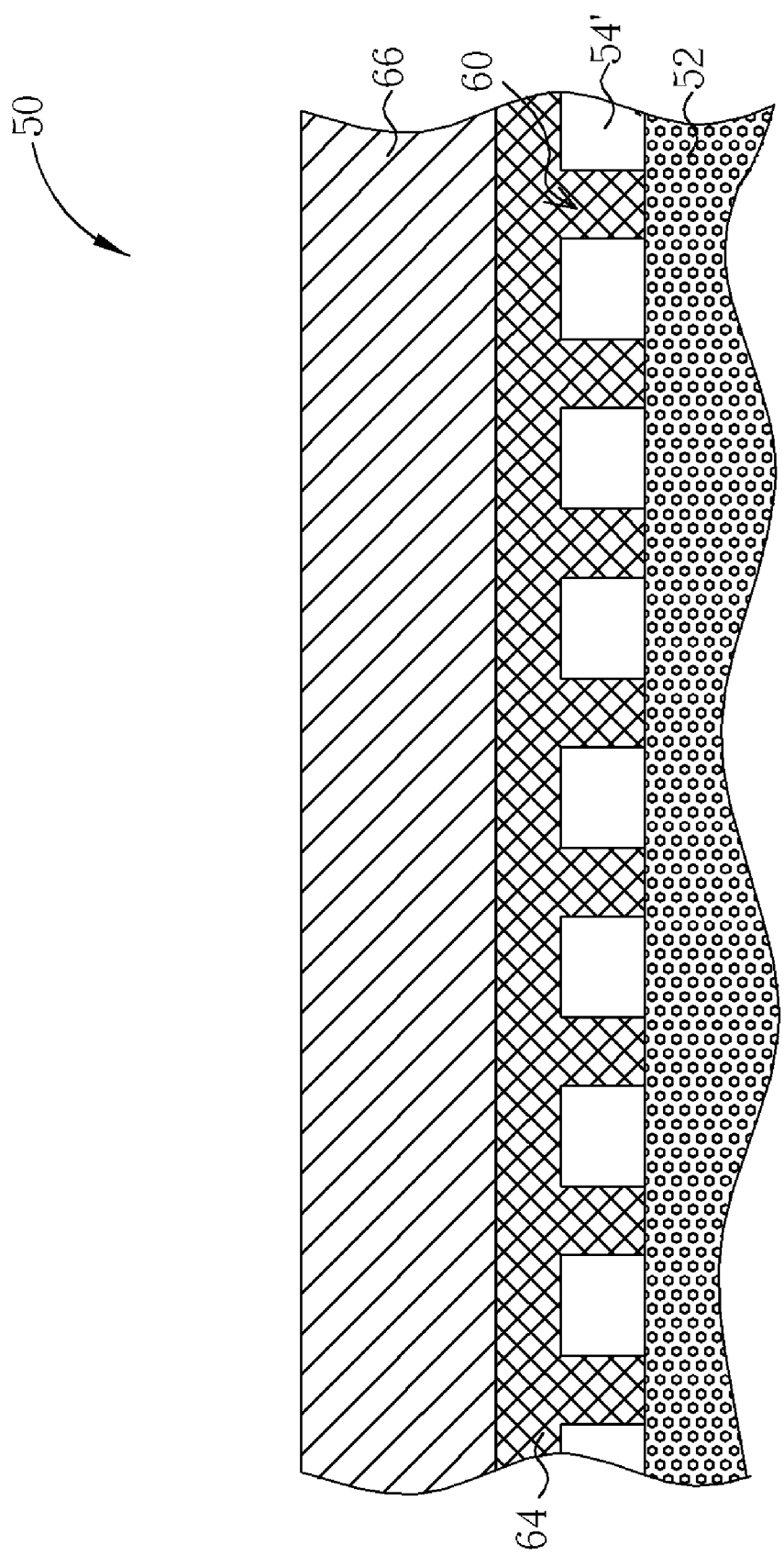

It is known from FIG. 8 that a BARC 64 and a second photoresist layer 66 are formed on the wafer 50 in sequence. The second photoresist layer 66 can be a positive photoresist or a negative photoresist layer. Preferably, the positive photoresist layer is applied.

Figure 9:
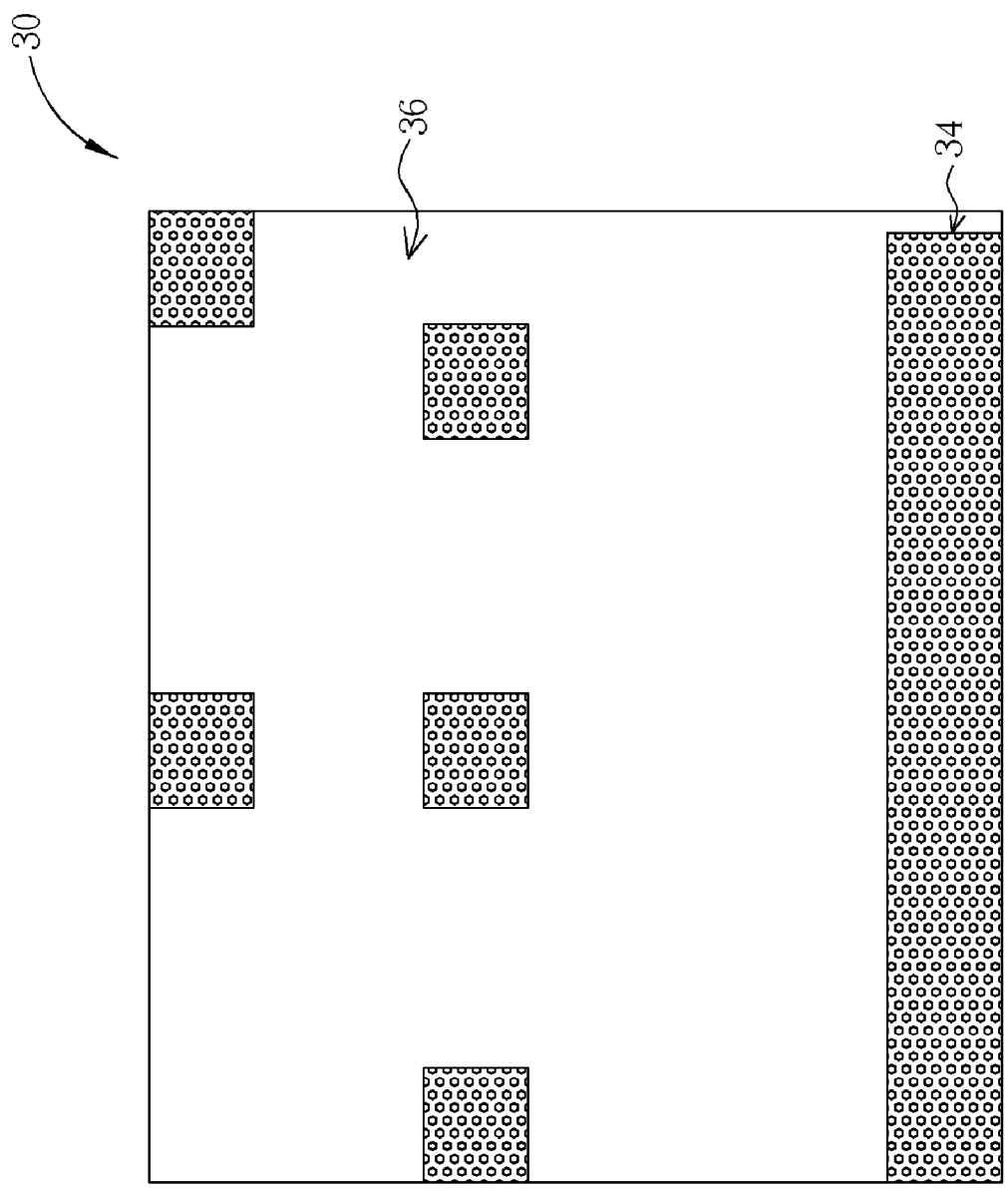

Please refer to FIG. 9, wherein a second lithography pattern 30 is provided to perform a second pattern transfer process. The second lithography pattern 30 comprises a first pattern region 34 and a second pattern region 36 respectively corresponding to the dense patterns 16 in the dense pattern region 12 and the iso patterns 18 in the iso pattern region 14 of the circuit pattern 10, as shown in FIG. 3. That is, the first pattern region 34 and the second pattern region 36 correspond to the region on the first patterned hard mask layer 54' which has the circuit pattern 10, e.g. the patterns of the contact holes 60 defined by the dense lithography patterns 22 and the iso lithography patterns 24.

Then a second pattern transfer process is performed to transfer the second lithography pattern 30 onto both the second photoresist layer 66 and the BARC 64.

Figure 10:
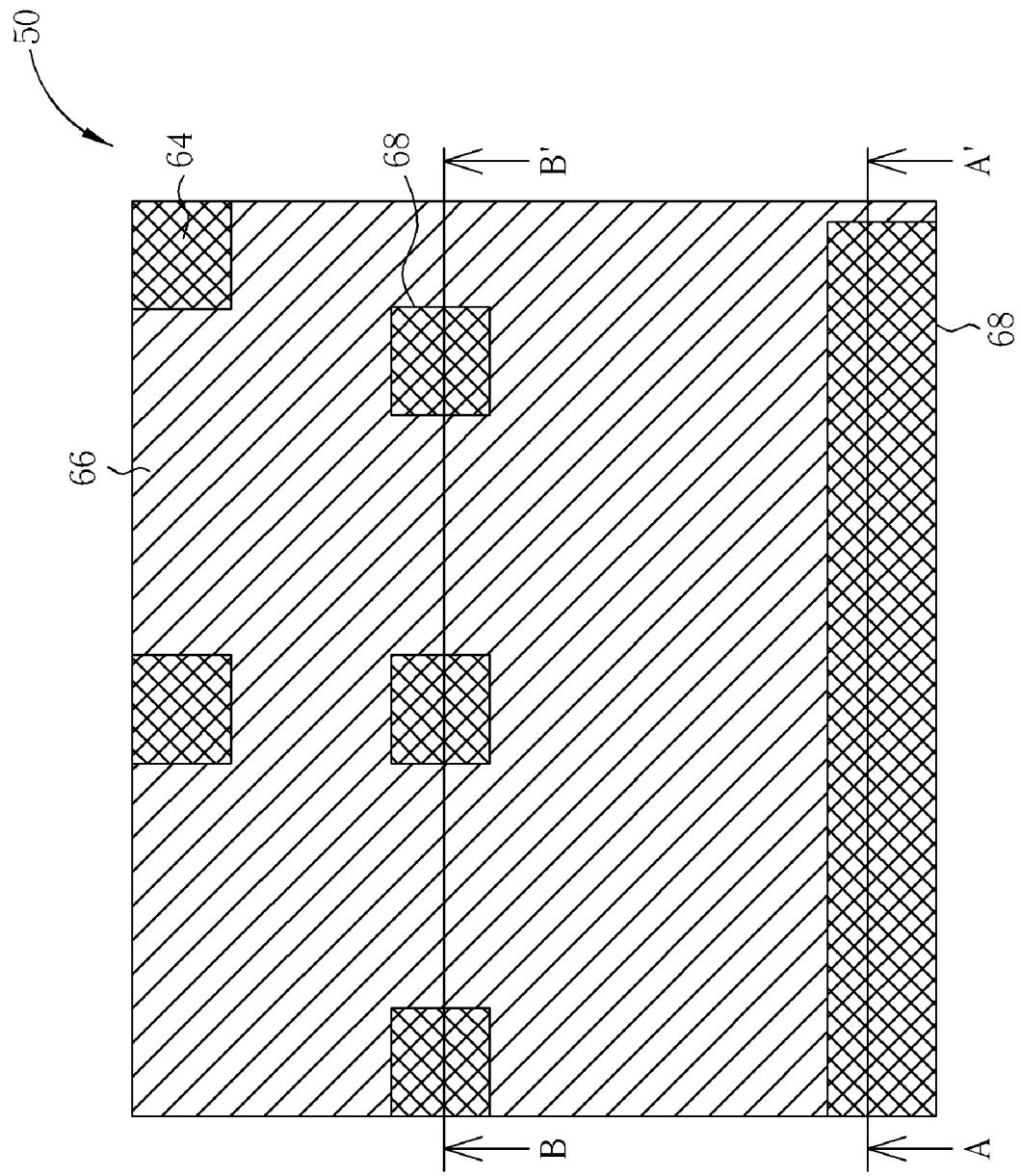
Figure 11:
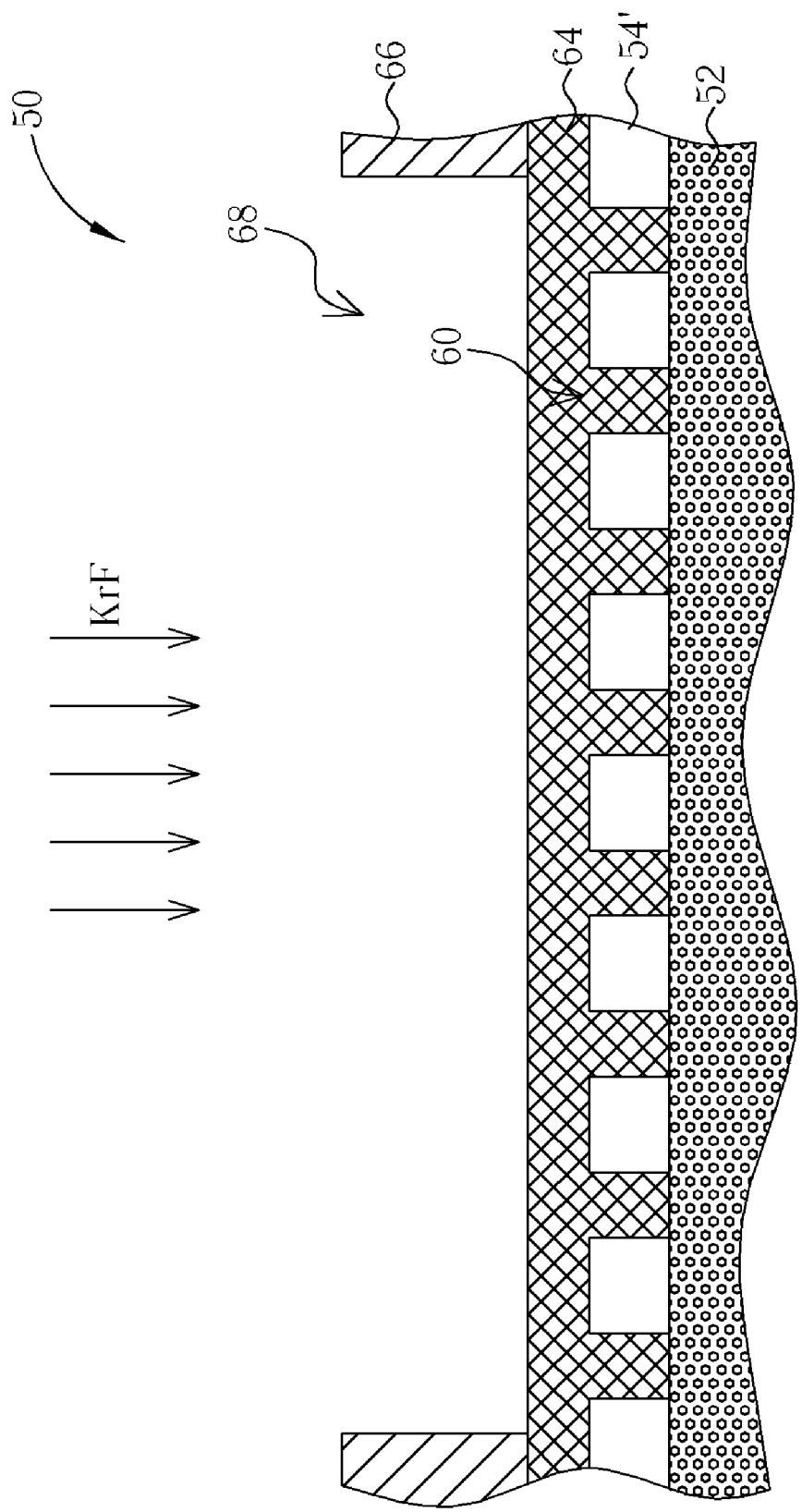
Figure 12:
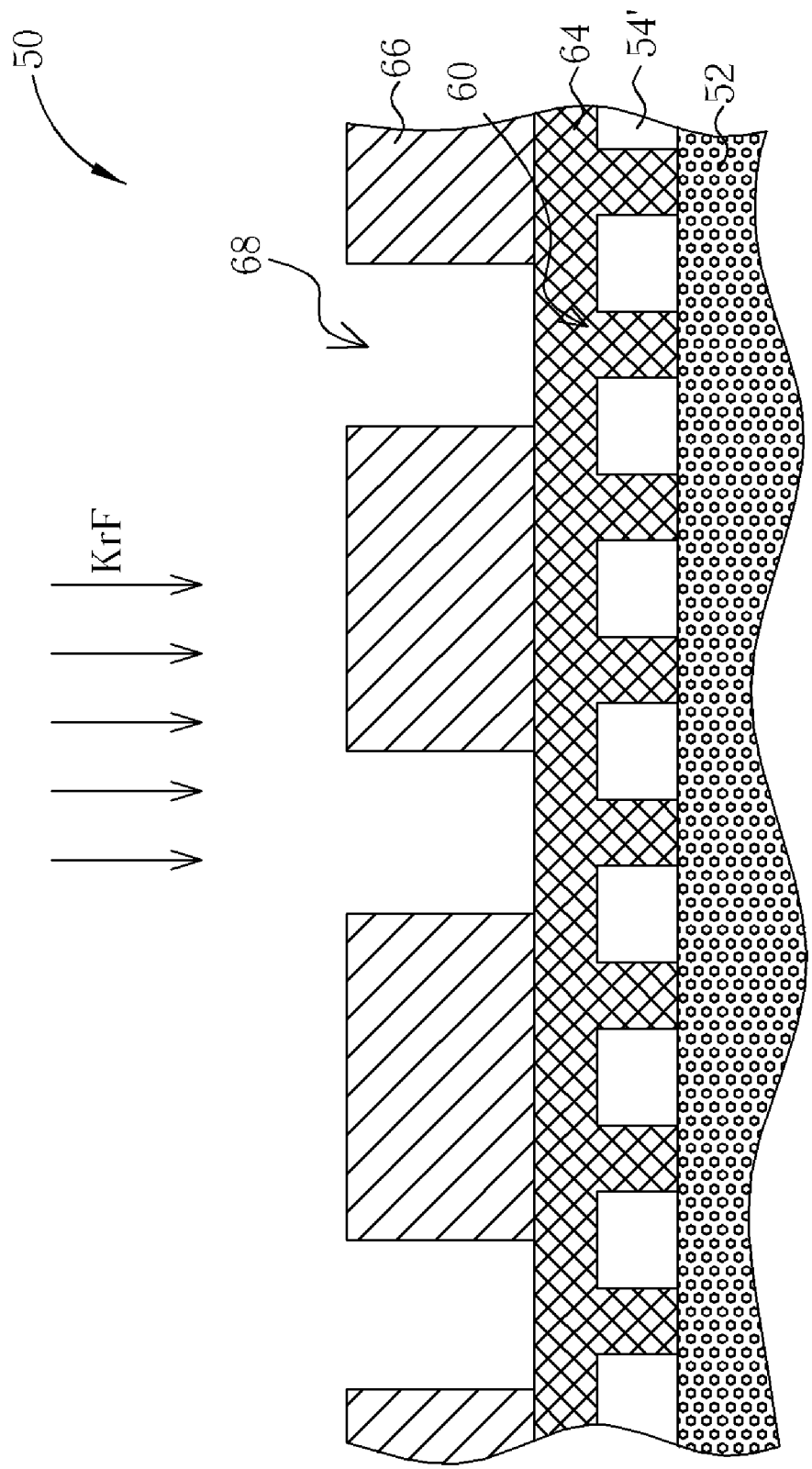

Please refer to FIG. 10 to FIG. 12. FIG. 10 is the top view of the wafer 50. FIG. 11 and FIG. 12 are cross-sections of the wafer 50 in FIG. 10 along AA' and BB', respectively. First, a second lithography pattern 30 is formed on a photo mask, and the photo mask is used to perform a lithography process to transfer the second lithography pattern 30 to the second photoresist layer 66. Then, a development process is performed to form a plurality of selecting patterns 68 on the second photoresist layer 66. In a preferred embodiment, a light source for the lithography process in the second pattern transfer process can be ArF or Krypton Fluoride (KrF). Because the second lithography pattern 30 defines parts corresponding to the circuit pattern 10 by regions, demands on the resolution are not as strict as those in the first pattern transfer process. So KrF, whose cost is low, is adopted for use as the light source. The second photoresist layer 66 can be a KrF photoresist, e.g. acetal. In addition, the thickness of the second photoresist layer 66 can be thicker than that of the first photoresist layer 56.

Figure 13:
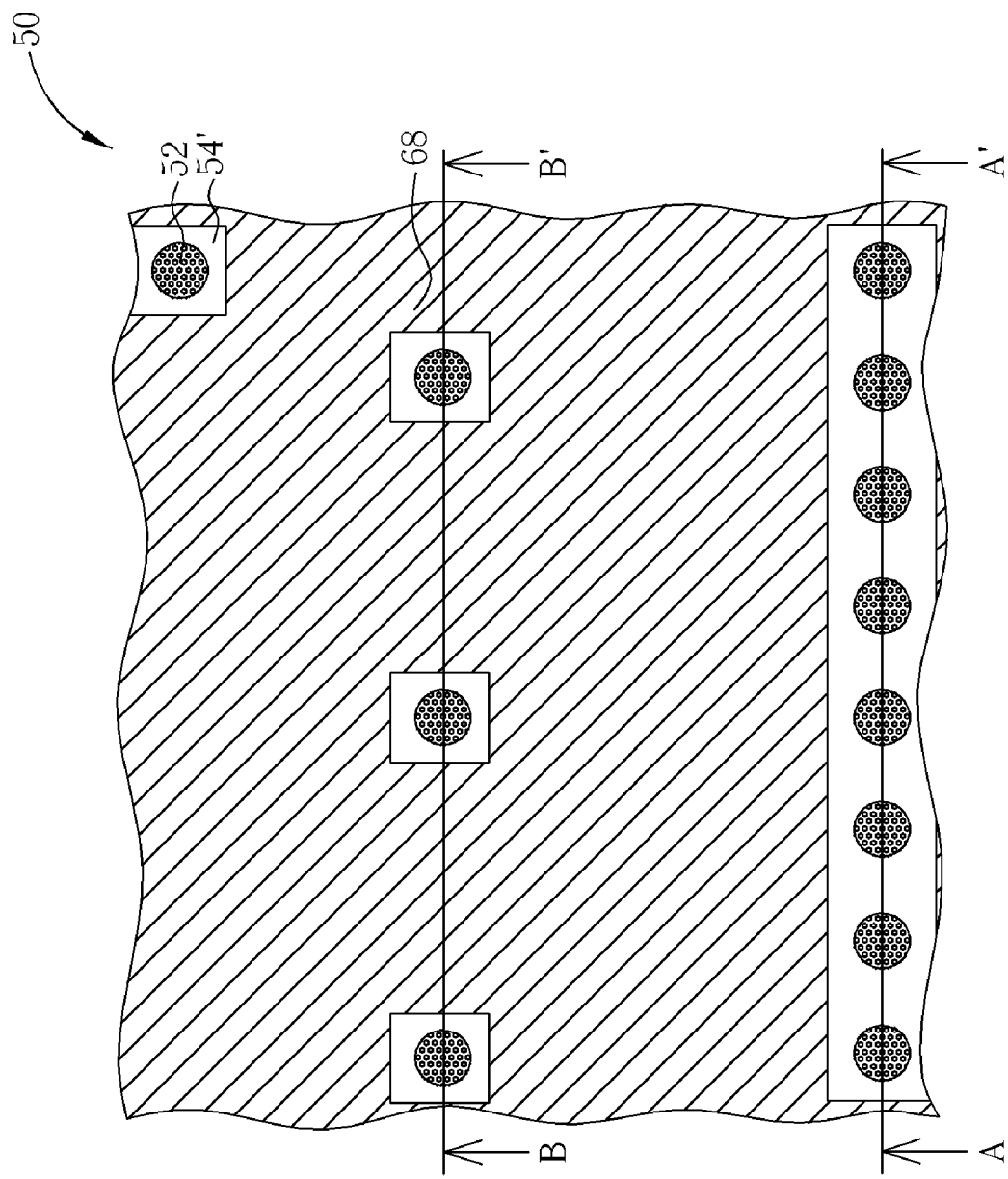
Figure 14:
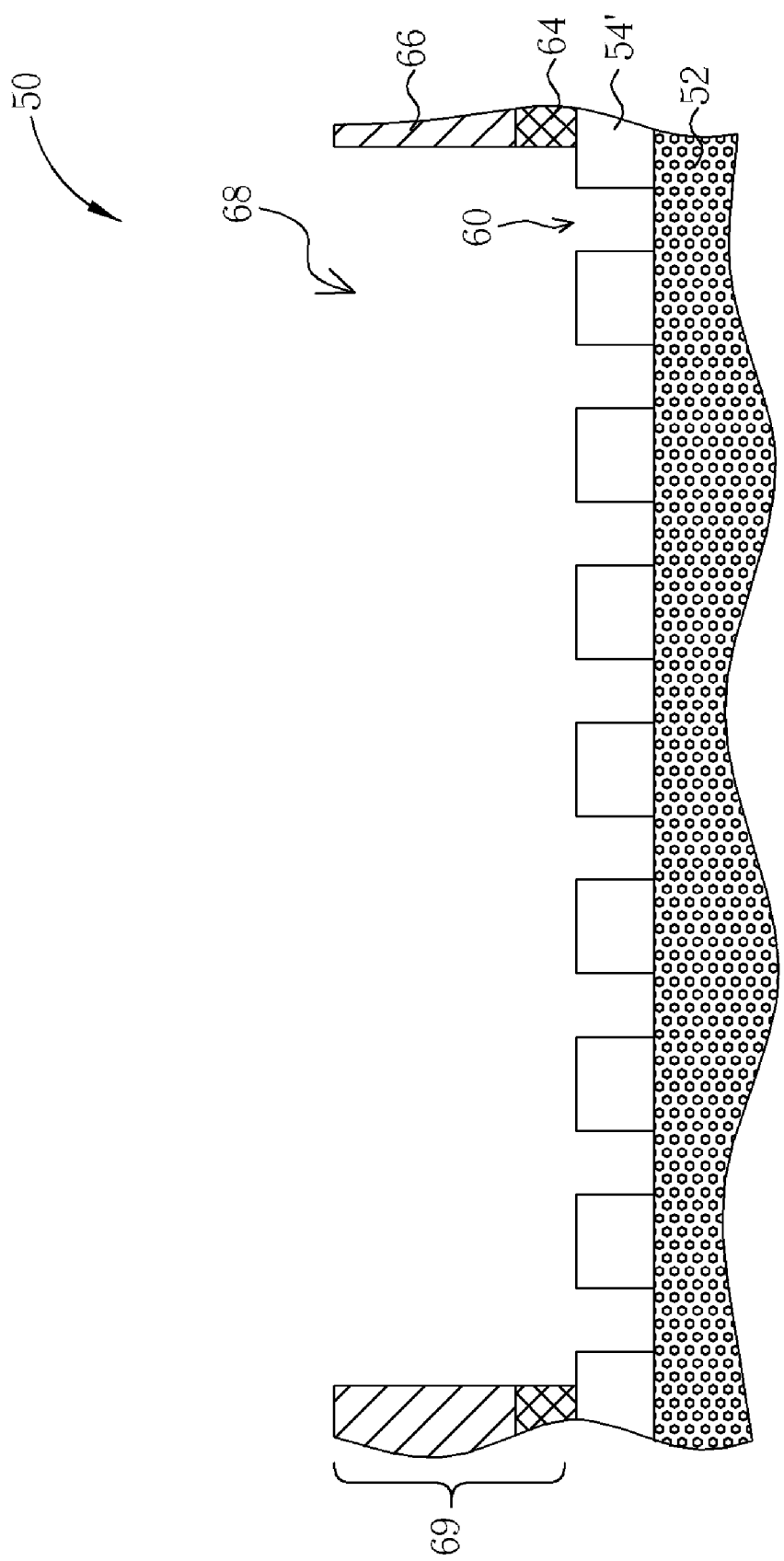
Figure 15:
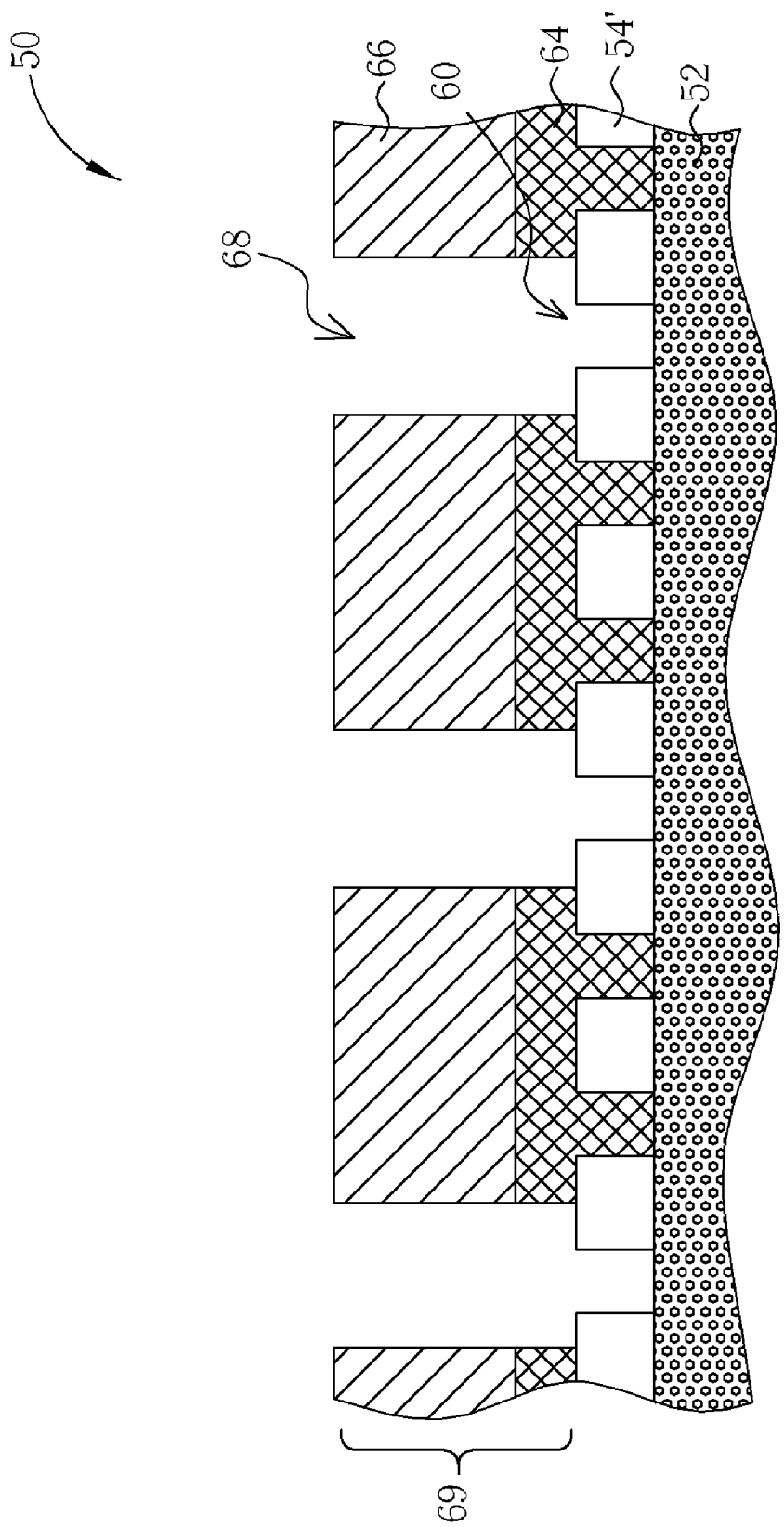

Please refer to FIG. 13 to FIG. 15. FIG. 14 and FIG. 15 are cross-sectional views of the wafer 50 in FIG. 13 along lines AA' and BB', respectively. Next, an etch process is performed by using the second photoresist layer 66 as a hard mask to remove the BARC 64 exposed by the selecting patterns 68, and the patterns of the contact holes in the selecting patterns 68 are formed. Now, the second photoresist layer 66 and the BARC 64 can be defined as the second patterned hard mask layer 69. The etchant in the above-mentioned process preferably has a large selective ratio between the BARC 64 and the first patterned hard mask layer 54' to prevent the first patterned hard mask layer 54' from being damaged during the removal of the BARC 64. In this embodiment, the etch process to remove the BARC 64 can be a reactive ion etch process. After the etch process, the first patterned hard mask layer 54', which has the patterns of the contact holes 60, is exposed by the selecting patterns 68, and the substrate 52 is exposed by the patterns of the contact holes 60. At this point, the second pattern transfer process is finished.

Figure 16:
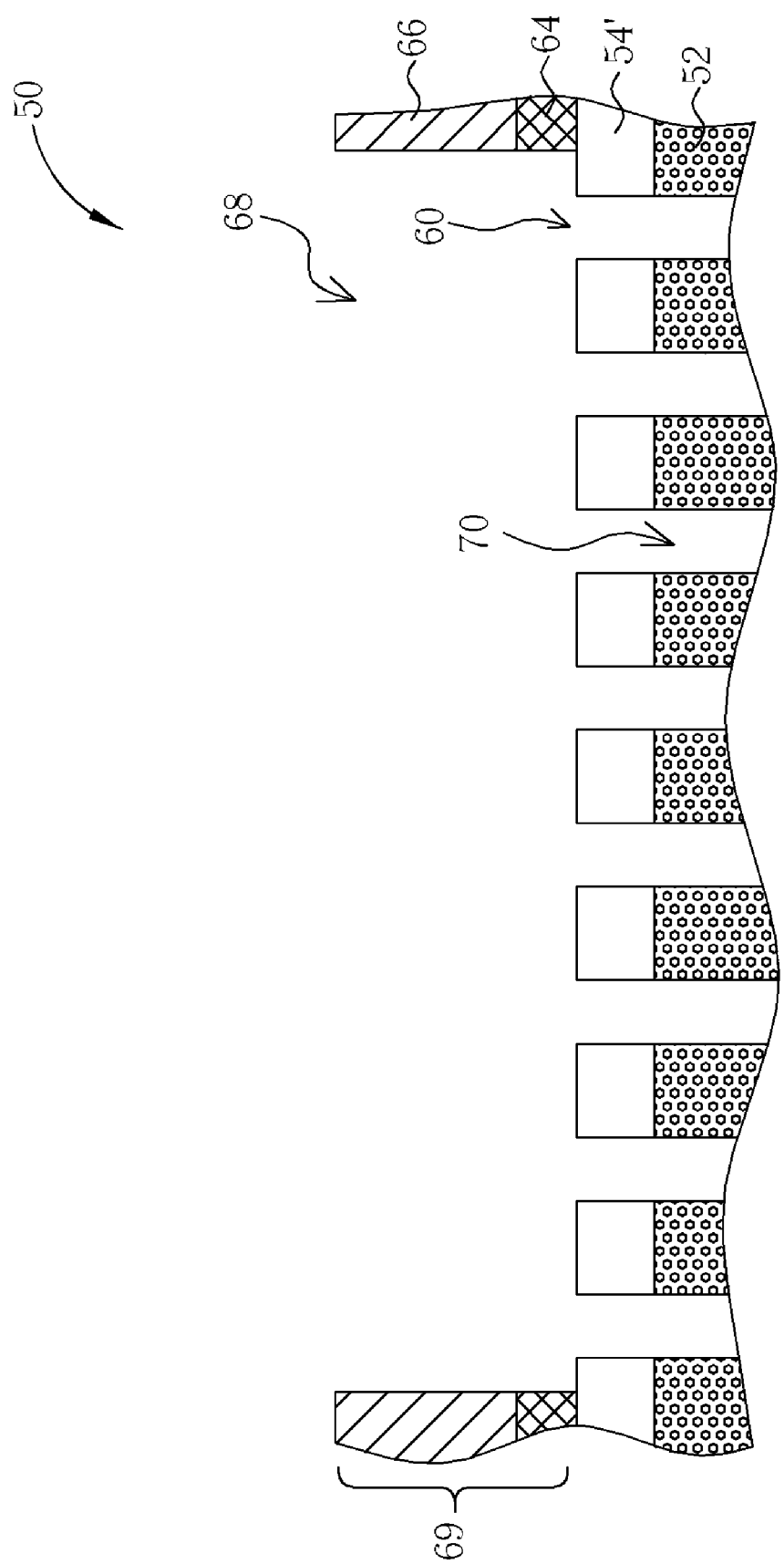
Figure 17:
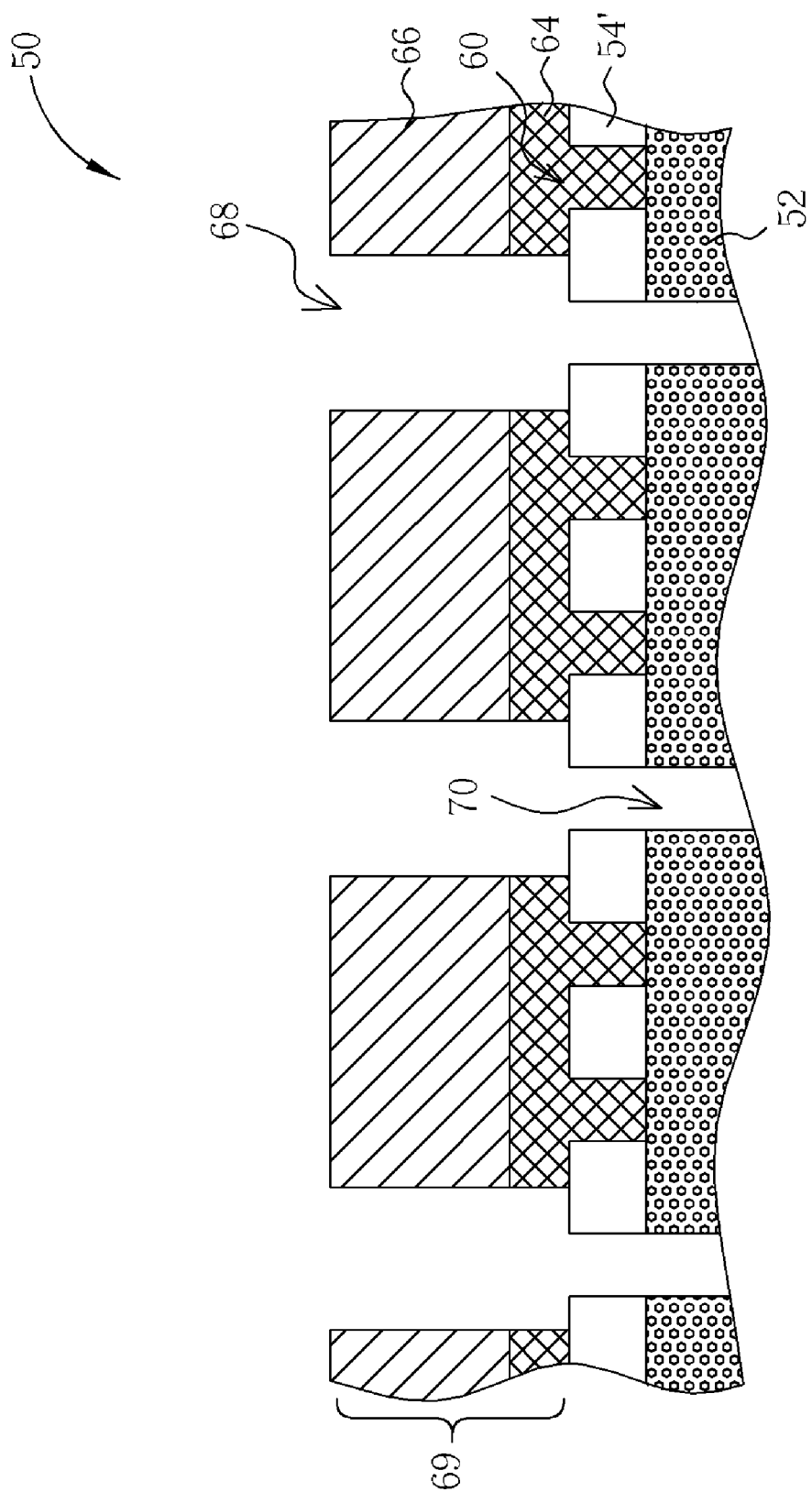

Next, the substrate 52 is etched by using the first patterned hard mask layer 54' as a hard mask to remove the substrate 52 which is exposed by the patterns of the contact holes 60 of the first patterned hard mask layer 54' and a plurality of contact holes 70 are formed on the substrate 52. FIG. 16 and FIG. 17 show respectively cross-sections of the substrate 52 that is etched in FIG. 14 and FIG. 15.

Figure 18:
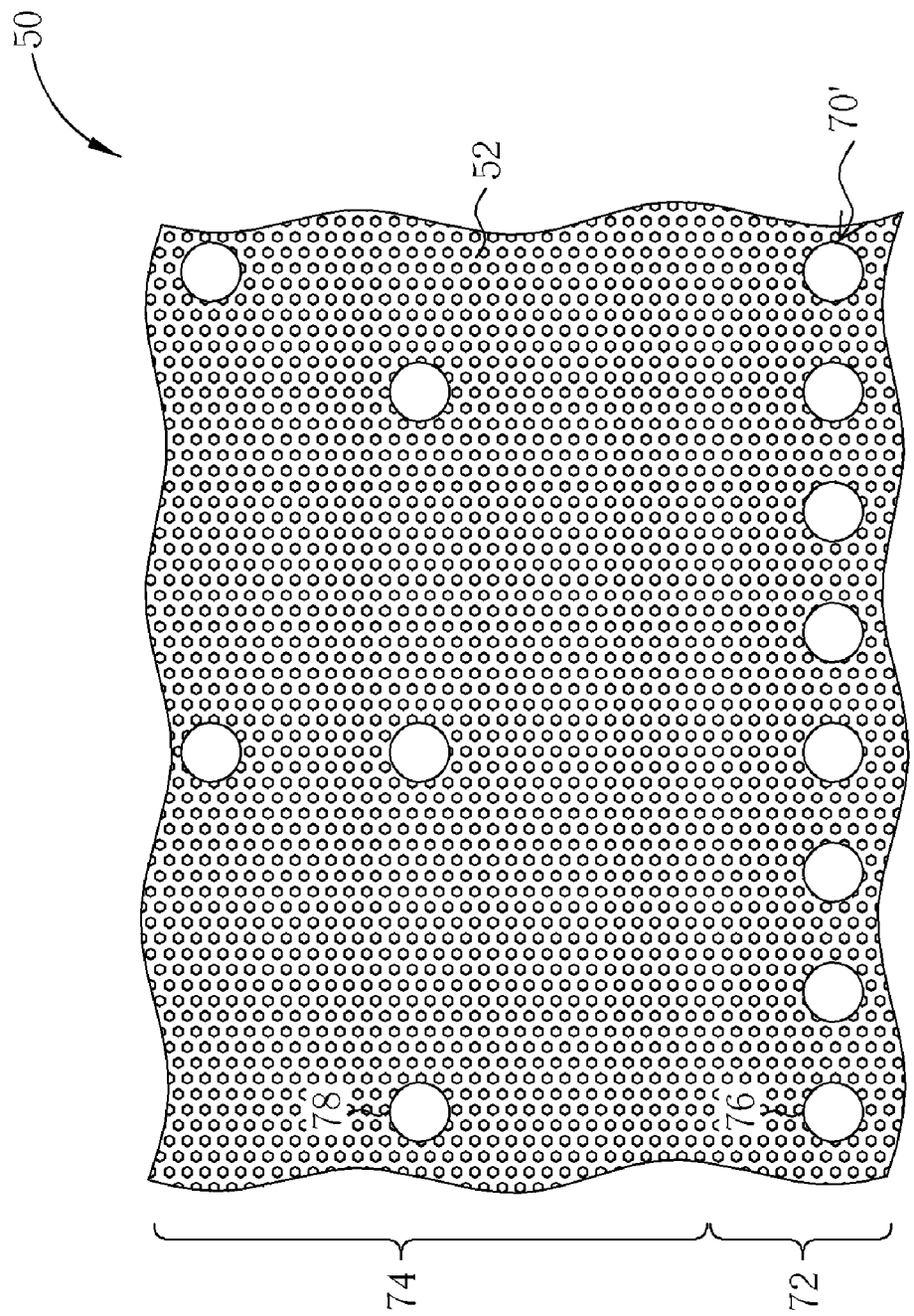

Finally, as shown in FIG. 18, the second patterned hard mask layer 69 (photoresist layer 66 and the BARC 64) and the first patterned hard mask layer 54' are removed. Then the substrate 52 having the circuit pattern 10 is formed. The surface of the substrate 52 comprising a plurality of the contact holes 70 forms a dense pattern region 70' and an iso pattern region 74. The dense pattern region 70' comprises a plurality of dense contact holes 76 having dense pitches. The iso pattern region 74 comprises a plurality of iso patterns 78 having large pitches. At this point, the circuit pattern 10 is transferred to the substrate 52.

Figure 19:
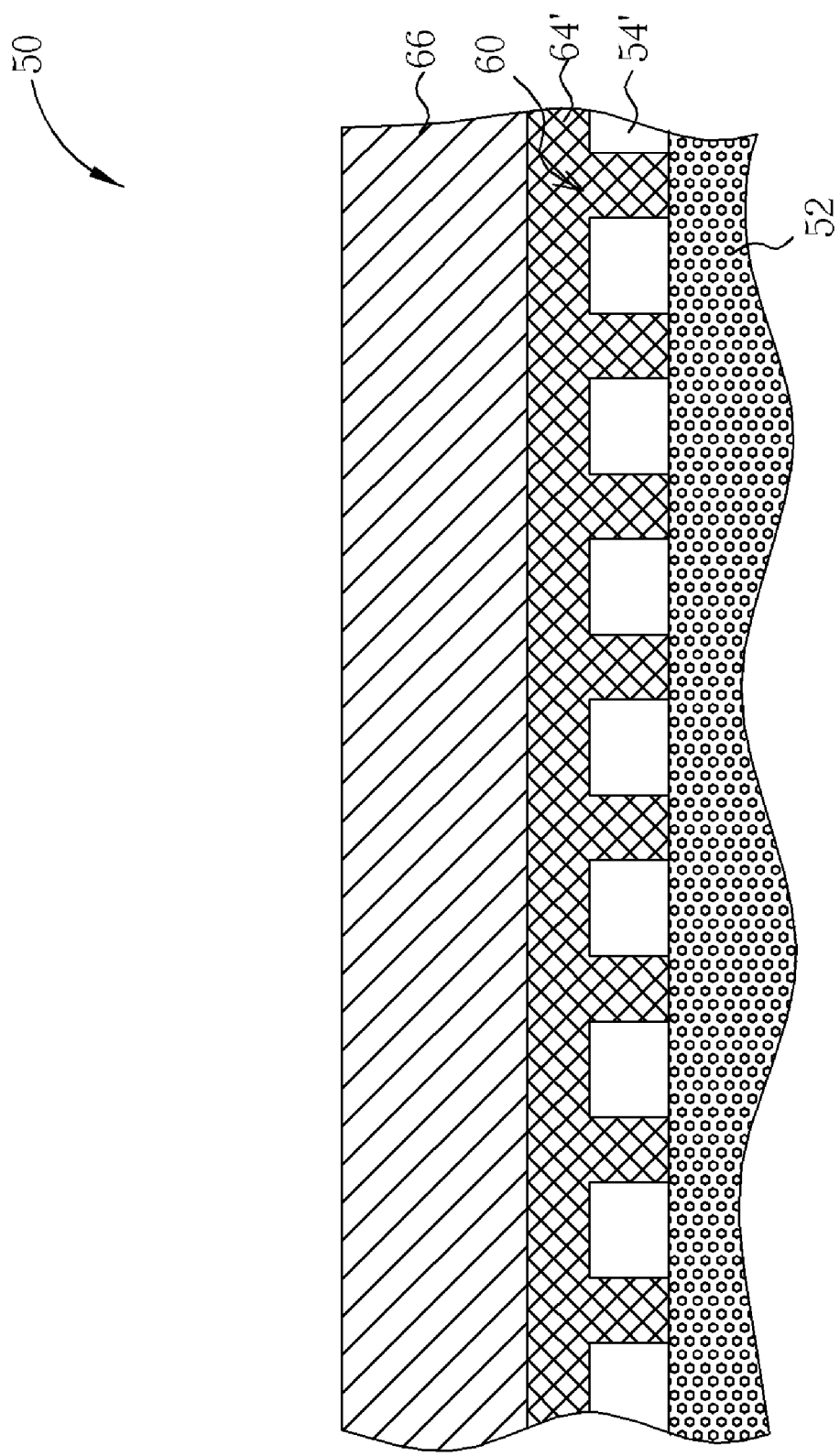
FIG. 19 to FIG. 22 are schematic views of a fabricating process of a second embodiment in the present invention.

FIG. 19 to FIG. 22 show schematic views of a fabricating process of the second embodiment of the present invention. Because parts of the method of the second embodiment are identical to the first embodiment, to simplify the description, the illustration of the second embodiment will start from the process after FIG. 7 in the first embodiment, and since all the elements are identical to those in the first embodiment, the same elements will still be designated with the same reference numerals. With reference to FIG. 19, a BARC 64' and a second photoresist layer 66 are formed in sequence on the first patterned hard mask layer comprising the first lithography pattern 20. It is noted that the material of the BARC 64' is a developable ARC, such as polyamic acid, and the second photoresist layer 66 is preferably a positive photoresist.

Figure 20:
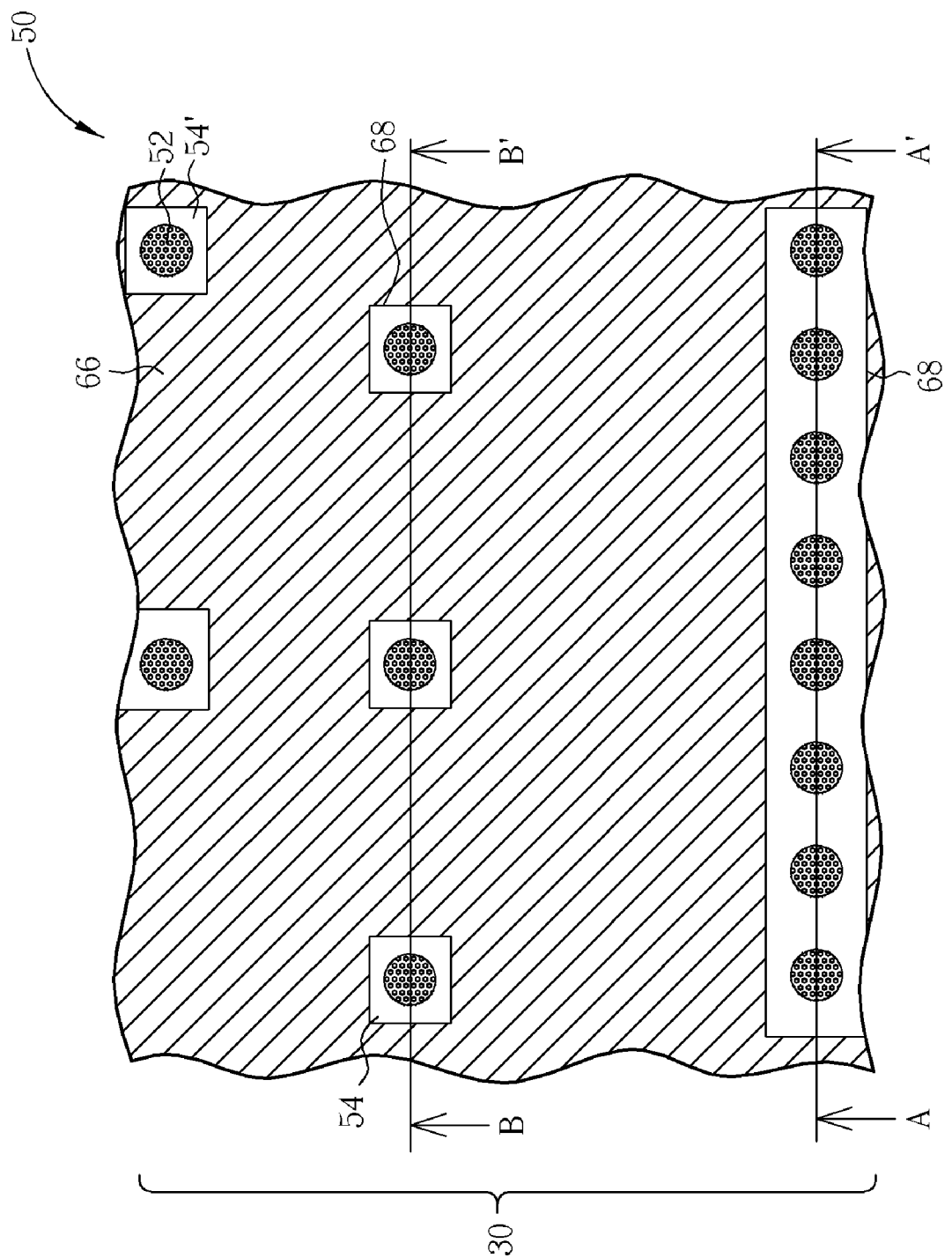
Figure 21:
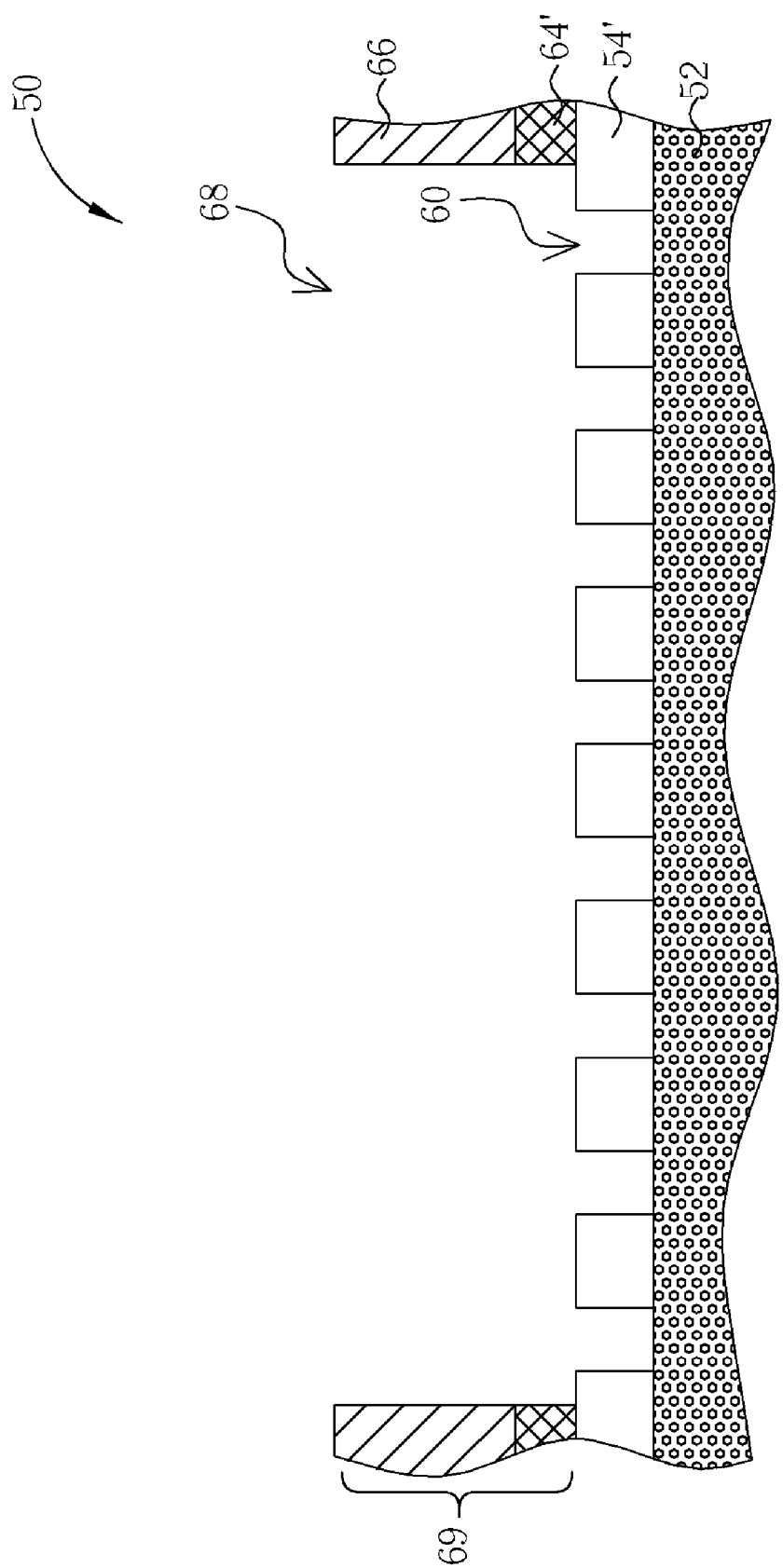
Figure 22:
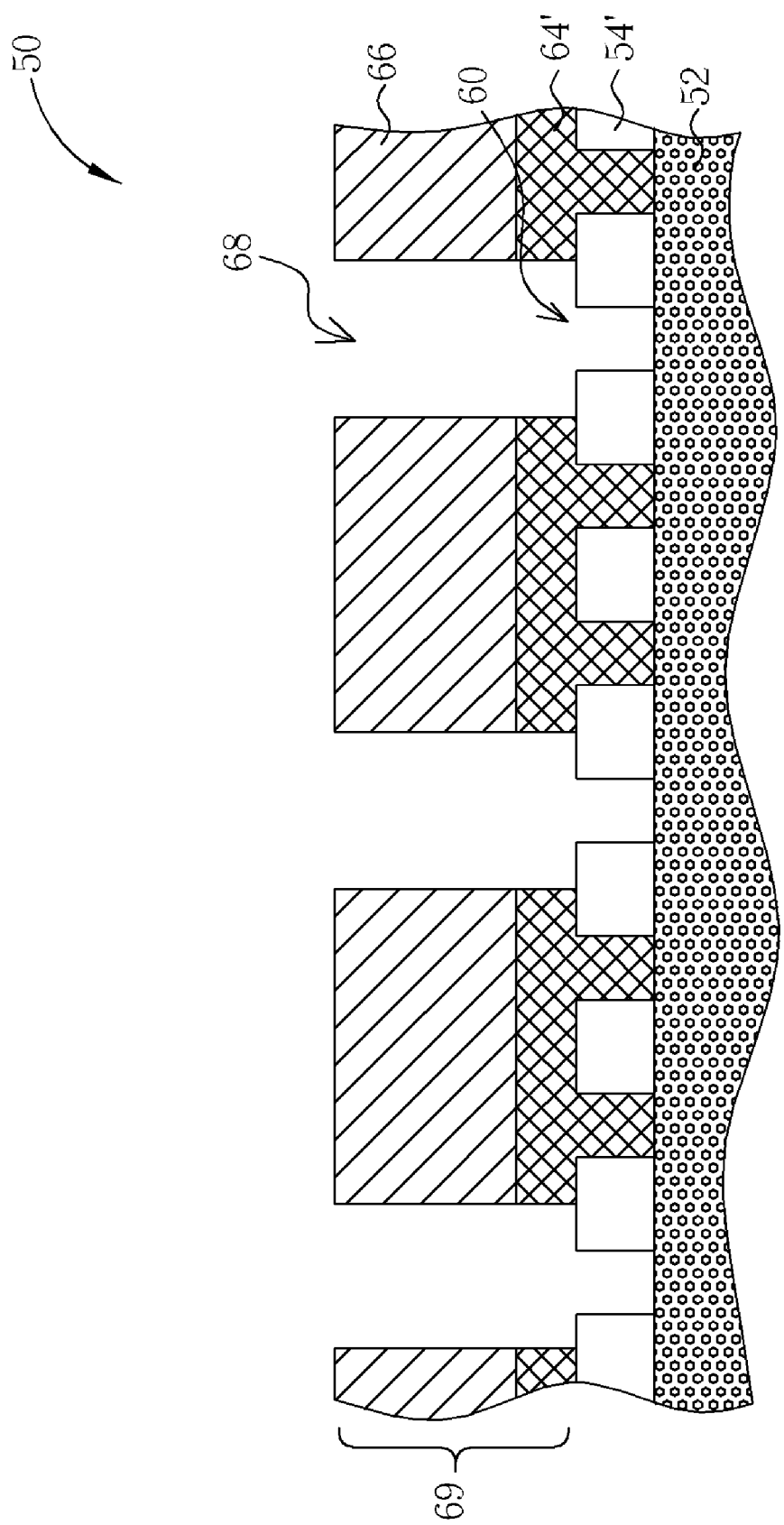

Next, as shown in FIG. 20 to FIG. 22, a second pattern transfer process is performed. FIG. 21 and FIG. 22 are cross-sectional views of the wafer 50 in FIG. 20 along the lines AA' and BB' respectively. A lithography process is performed to form the second lithography pattern 30 on the second photoresist layer 66. The second lithography pattern 30 comprises a plurality of selecting patterns 68 corresponding to the dense patterns 16 or the iso patterns 18 on the circuit pattern 10. Then, the second photoresist layer 66 undergoes a development process. Because the material of the BARC 64' is the developable ARC, the second photoresist layer 66 which is exposed and the exposed part of the BARC 64' under the second photoresist layer 66 are removed in the development process. Therefore, a second patterned hard mask layer 69 is formed. After the development process, the first patterned hard mask layer 54', which comprises patterns of the contact holes 60, is exposed. Because the BARC 64' exposing the patterns of the contact holes is also removed in the development process, the substrate 52 is also exposed by the patterns of the contact holes 60. Finally, the first patterned hard mask layer 54' exposed by the selecting patterns 68 is used as a hard mask to perform an etch process to remove part of the substrate 52 exposed by the patterns of the contact holes 60. At this point, the circuit pattern 10 is formed on the substrate 52.

In this embodiment, because the BARC 64' is the developable ARC, the anti-etching property of the second lithography pattern can be improved and the step of etching the BARC 64' in order to form the patterns of the contact holes 60 (formed in the first pattern transfer process) on the second photoresist layer 66 can be omitted. Further, damage of the patterns of the contact holes 60 or the first patterned hard mask layer 54' can be prevented in the etch process.

Figure 23:
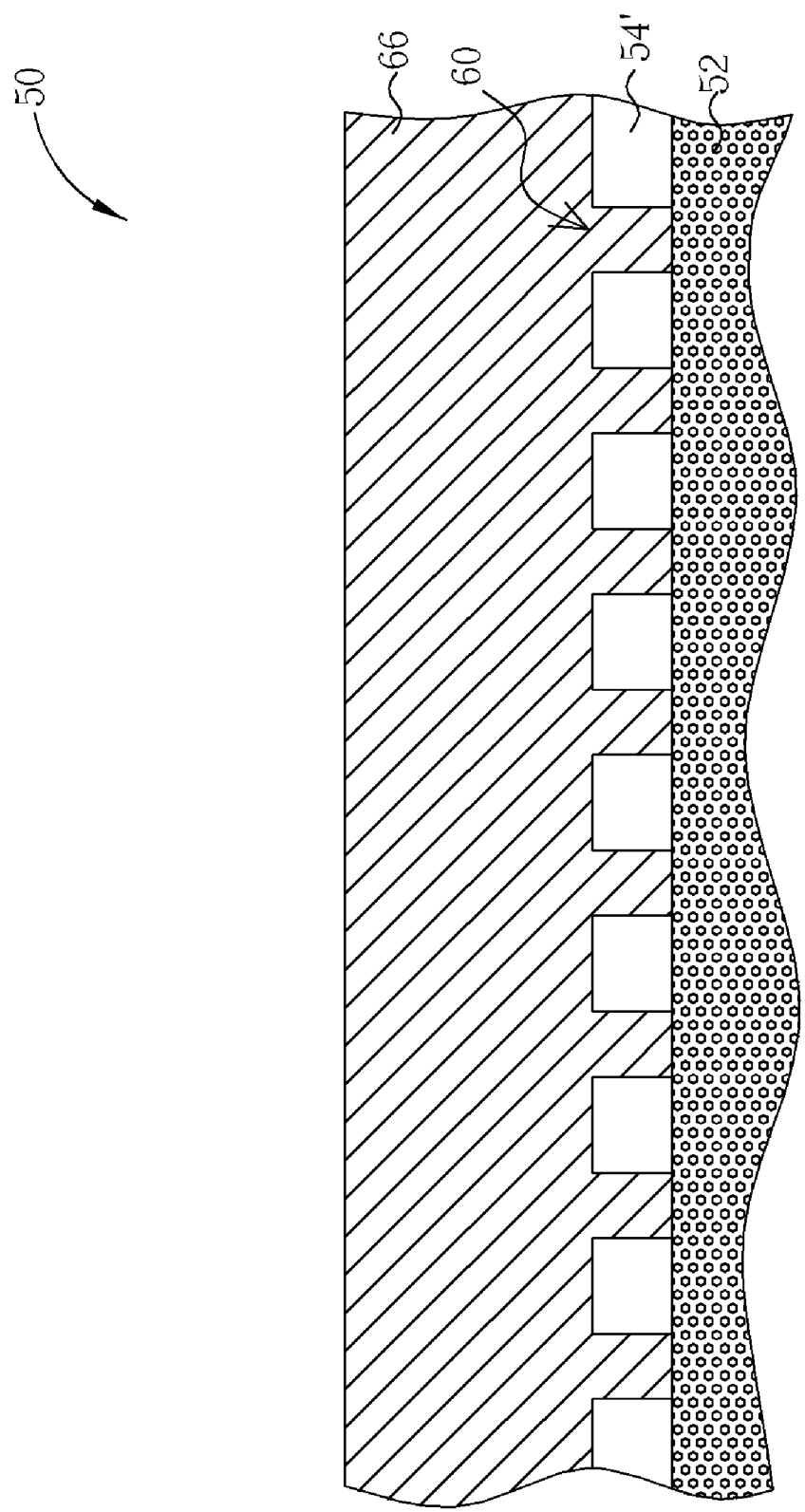
FIG. 23 to FIG. 26 are schematic views of a fabricating process of a third embodiment in the present invention.
Figure 24:
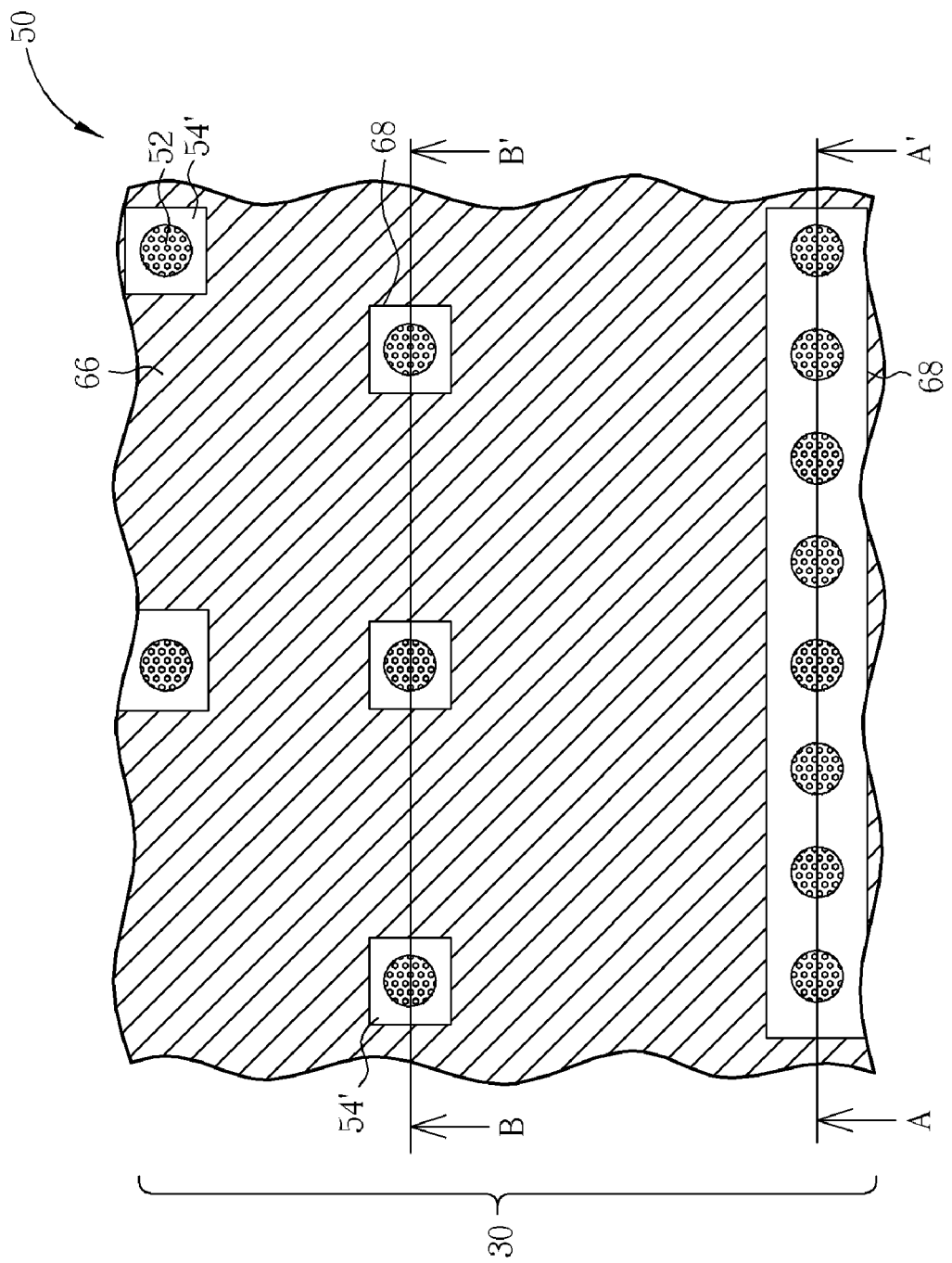
Figure 25:
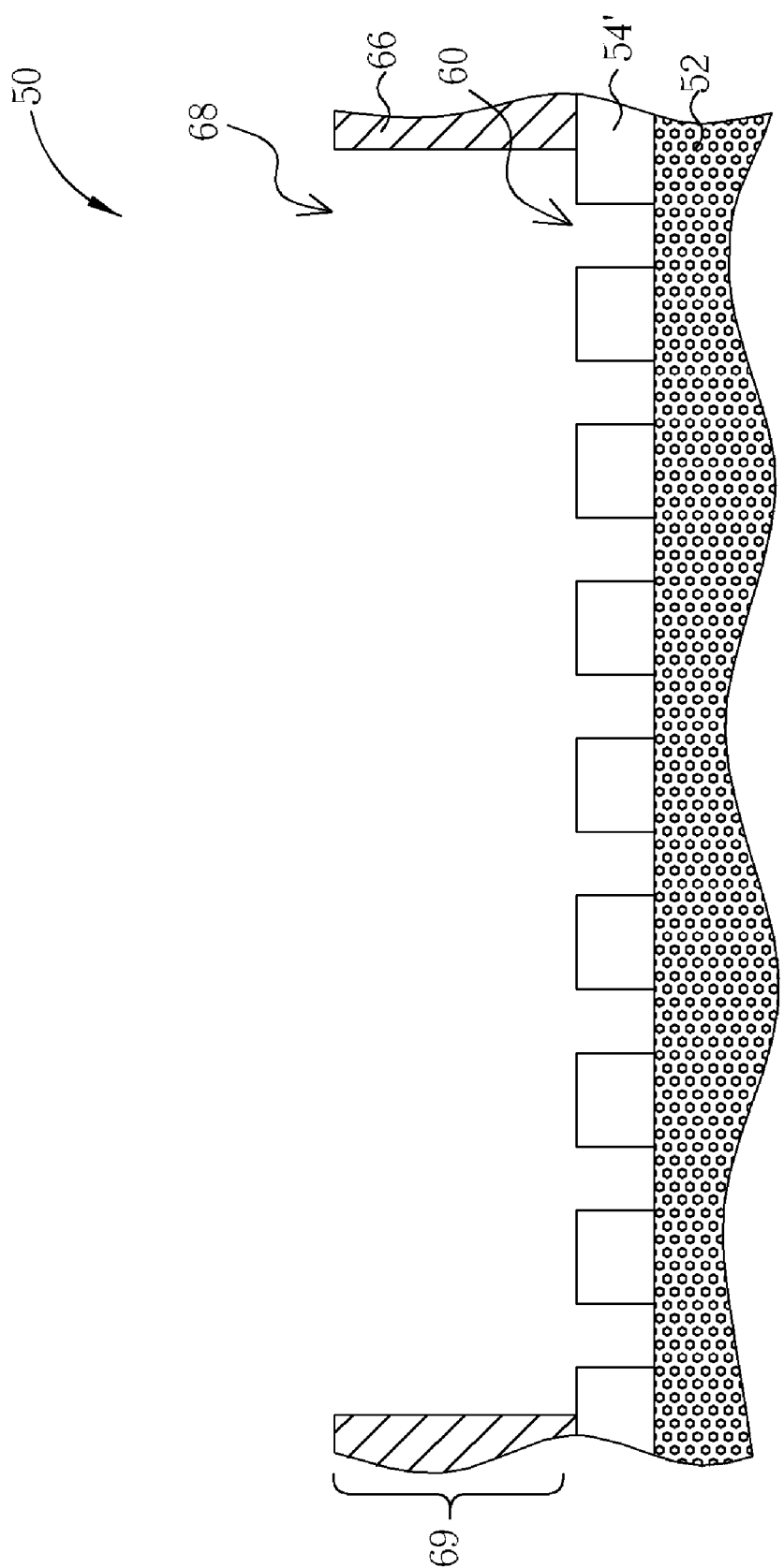
Figure 26:
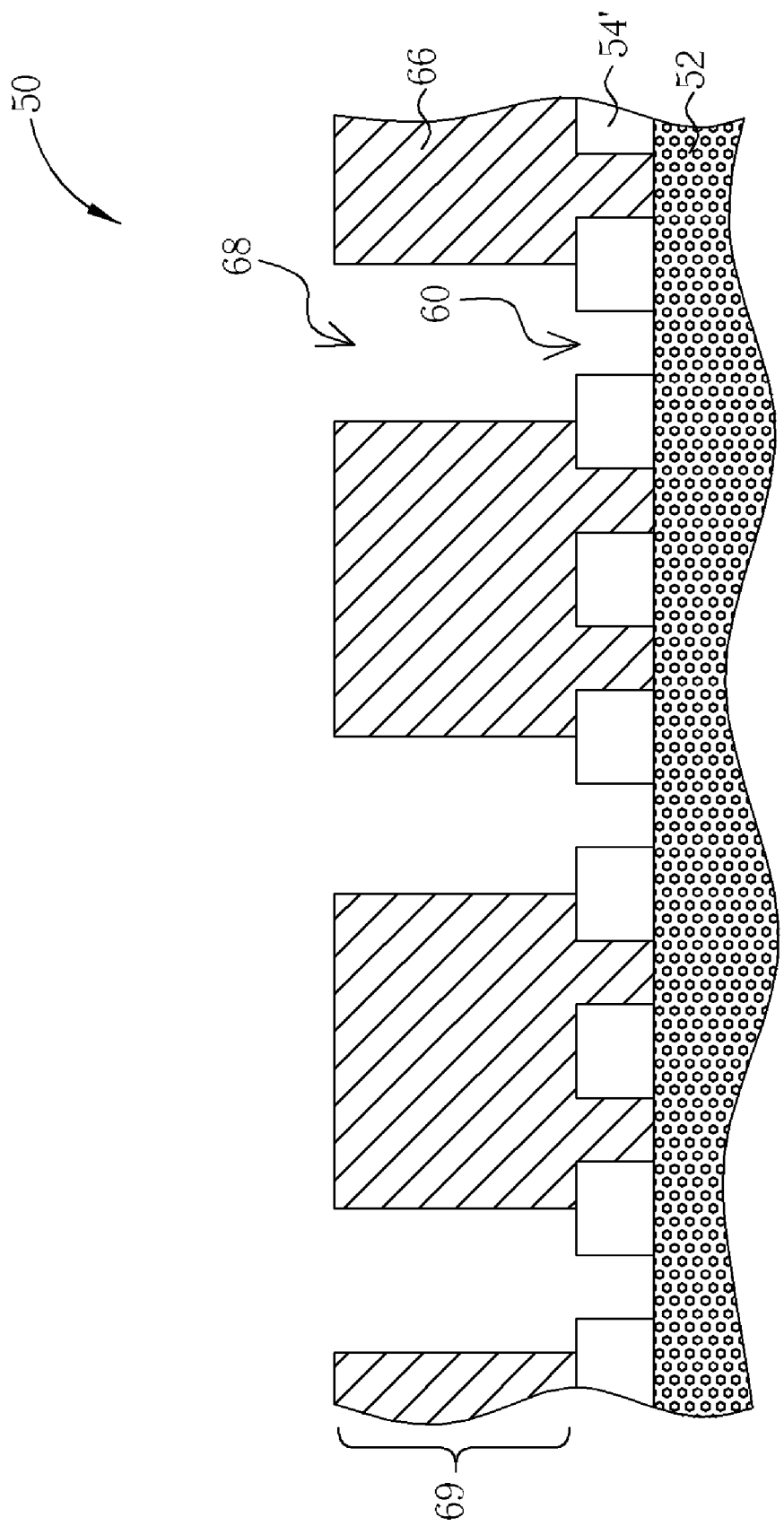
Figure 27:
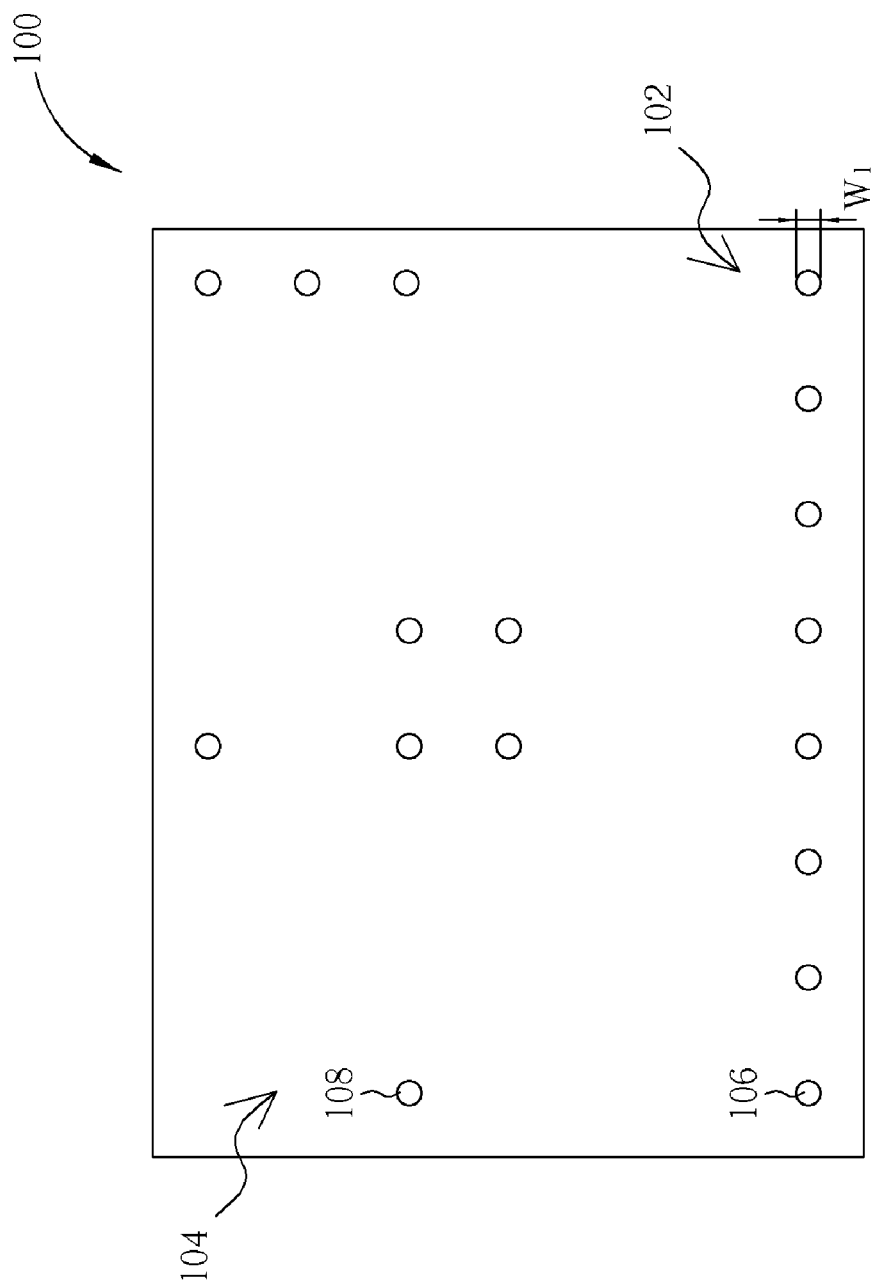
FIG. 27 to FIG. 34 are schematic views of a fabricating process of a fourth embodiment in the present invention.

FIG. 23 to FIG. 26 show schematic views of a fabricating process of the third embodiment in the present invention. FIG. 25 and FIG. 26 are cross-sections of the wafer 50 in FIG. 24 along AA' and BB', respectively. To simplify the description, illustration of the third embodiment starts after the patterns of the contact holes are formed on the hard mask layer 54 in FIG. 7. As shown in FIG. 23, a second photoresist layer 66 is formed on the surface of the first patterned hard mask layer 54' after the first photoresist layer 54 is removed, and the formation of the BARC is not needed. It is worthy of note that the second photoresist layer 66 in this embodiment is negative photoresist.

Next, with reference to FIG. 24 to FIG. 26, the second pattern transfer process is performed. First, a lithography process is performed to transfer the second lithography pattern 30 to the second photoresist layer 66 to define the selecting pattern 68. The selecting patterns 68 correspond to the dense patterns 16 or iso patterns 18. Next, a development process is performed to remove part of the second photoresist layer 66 not exposed to the light source (including the second photoresist layer 66 in the patterns of the contact holes). Then, the selecting patterns 68 are formed in the second photoresist 66, and the first patterned hard mask layer 54' having part of the patterns of the contact holes 60 and the substrate 52 exposed by the patterns of the contact holes 60 are exposed.

Therefore, in this embodiment, the first photoresist layer 66 is taken as a second patterned hard mask layer 69. Following that, the first patterned hard mask layer 54' is used as a hard mask to perform an etch process on the substrate 52. Thus, the circuit pattern 10 is formed.

In this embodiment, the second photoresist layer 66 is negative photoresist, which provides better flatness, so the BARC does not need to be formed on the hard mask layer 54. Therefore, one step in the etch process utilized to form the patterns of the contact holes 60 can be omitted. Although positive photoresist has a better exposing resolution and development profile than negative photoresist, in the second lithography process, the demand on the resolution is not so strict in the process of transferring the circuit pattern 10 to the second photoresist layer 66. So the negative photoresist can offer good quality in the second lithography process, and the cost can be reduced.

FIG. 27 to FIG. 34 are schematic views of a fabricating process in a fourth embodiment of the present invention. In this embodiment, the circuit pattern 100 should be transferred to the substrate 150 (shown in FIG. 30) on the wafer 150. The circuit pattern 100 comprises a dense pattern region 102 and an iso pattern region 104. The dense pattern region 102 comprises a plurality of dense patterns 106 positioned densely and the iso pattern region 104 comprises at least an iso pattern 108 with large pitch. In this embodiment, the width W1 of the dense patterns 106 and of the iso pattern 108 is very small, e.g. 60 to 80 nm, which already exceeds the size limit for fabrication in traditional lithography technology.

Figure 28:
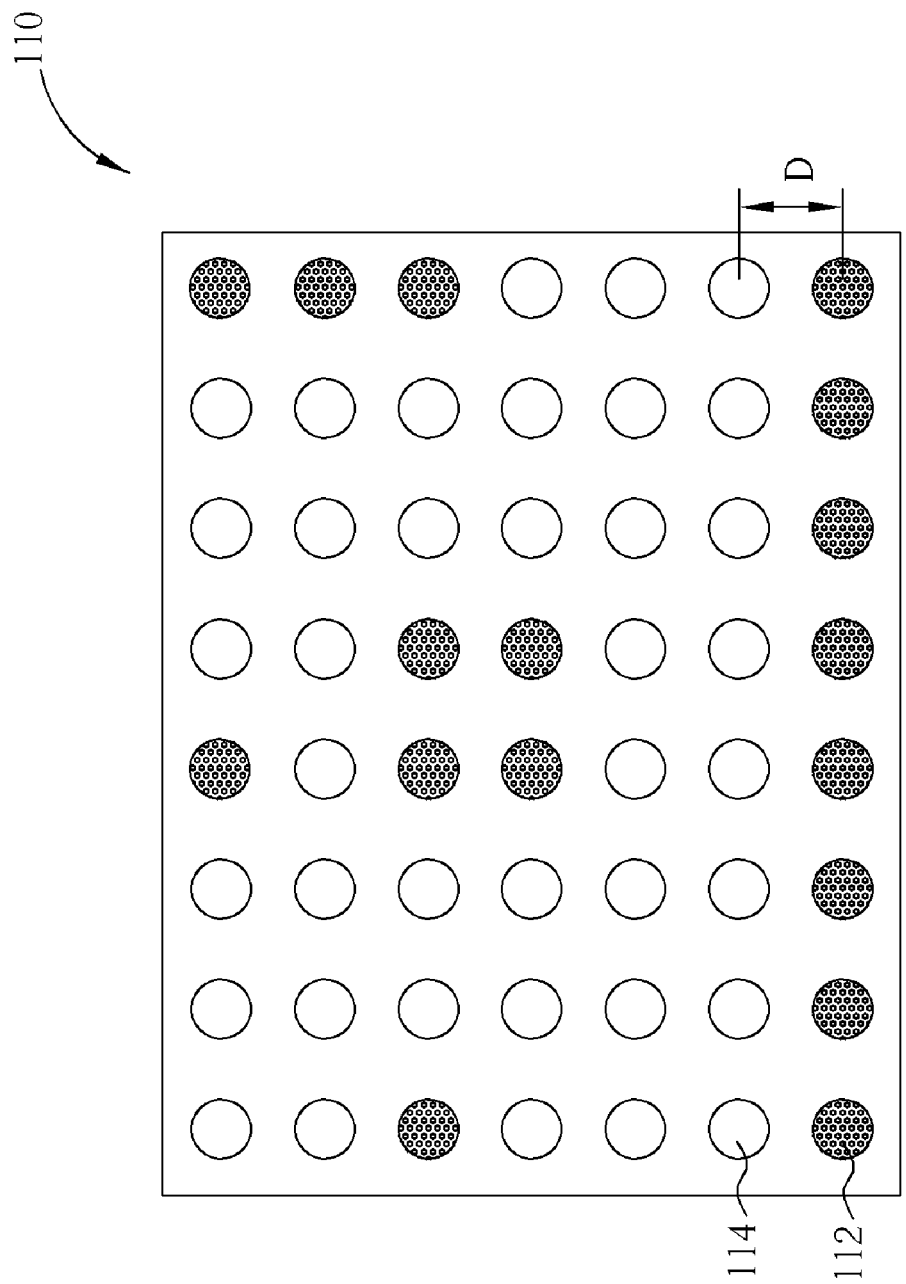
Figure 29:
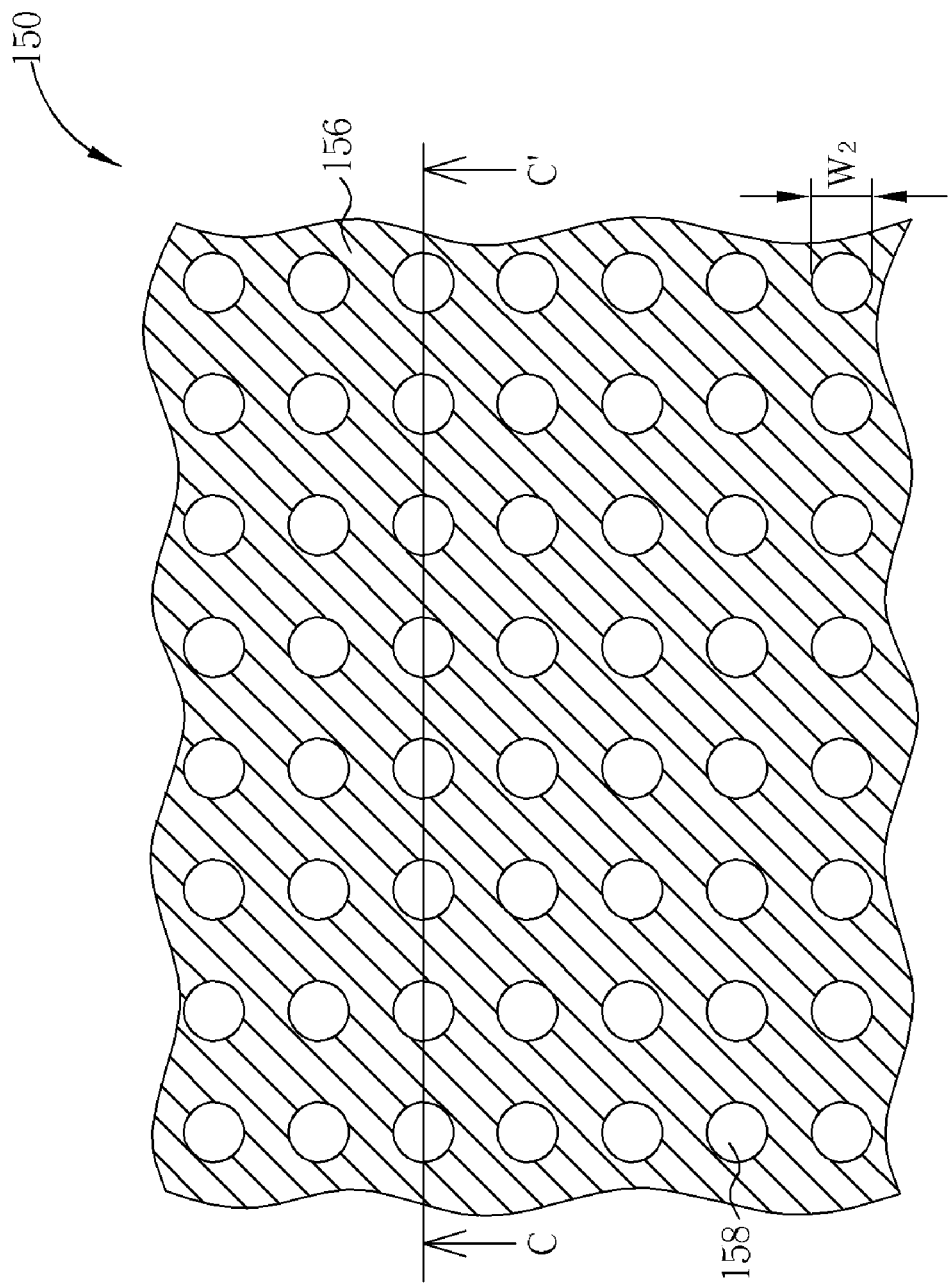
Figure 30:
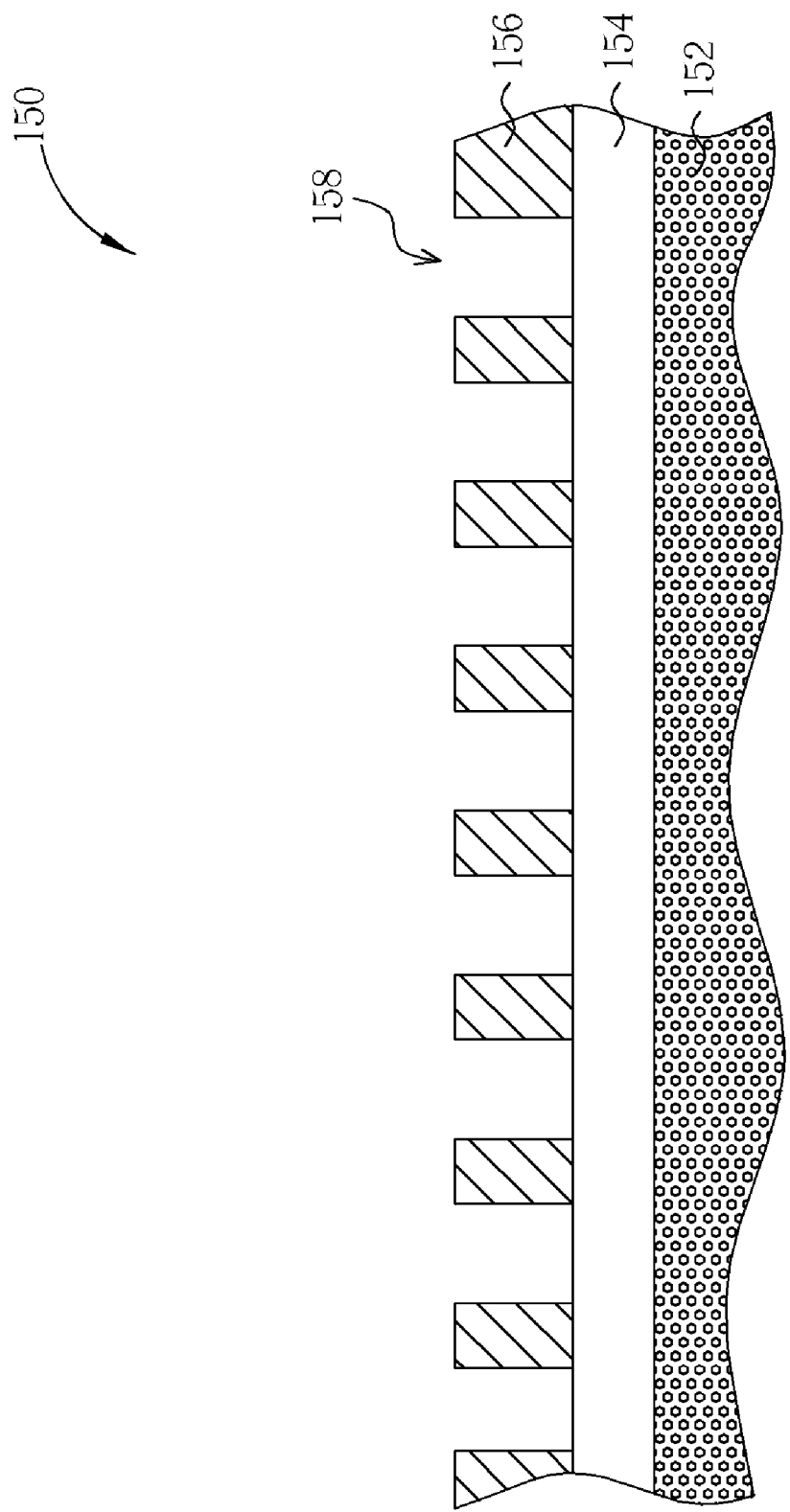

A hard mask layer 154 and a first photoresist layer 156 (shown in FIG. 30) are formed sequentially on the surface of the substrate 152 before the pattern transfer. As shown in FIG. 28, a first lithography pattern 110 comprises a plurality of the lithography circuit patterns 112, indicated by a dots pattern, which corresponds to the dense patterns 106 or the iso patterns 108 on the circuit pattern 100, respectively. In addition, the first lithography pattern 110 further comprises a plurality of dummy patterns 114 positioned among the lithography circuit patterns 112. The pitch D between the dummy pattern 114 and the lithography circuit pattern 112, and the pitch between two adjacent dummy patterns 114 are identical. Therefore, the first lithography pattern 110 forms an array pattern. Then, a lithography process is performed, and the first lithography pattern 110 is transferred to the first photoresist layer 156 to form an array lithography pattern 158, as shown in FIG. 29 and FIG. 30. FIG. 30 is cross-section of the wafer 150 in FIG. 29 along CC'. It is worthy of note that the width $W_2$ of the lithography pattern 158 can be designed based on the light source (such as ArF) and the material of the first photoresist layer 156. To optimize resolution, the width $W_2$ of the lithography pattern 158 should be larger than that of the target width $W_1$ of the circuit pattern 100. In this embodiment, the width $W_2$ is 100 nm.

Figure 31:
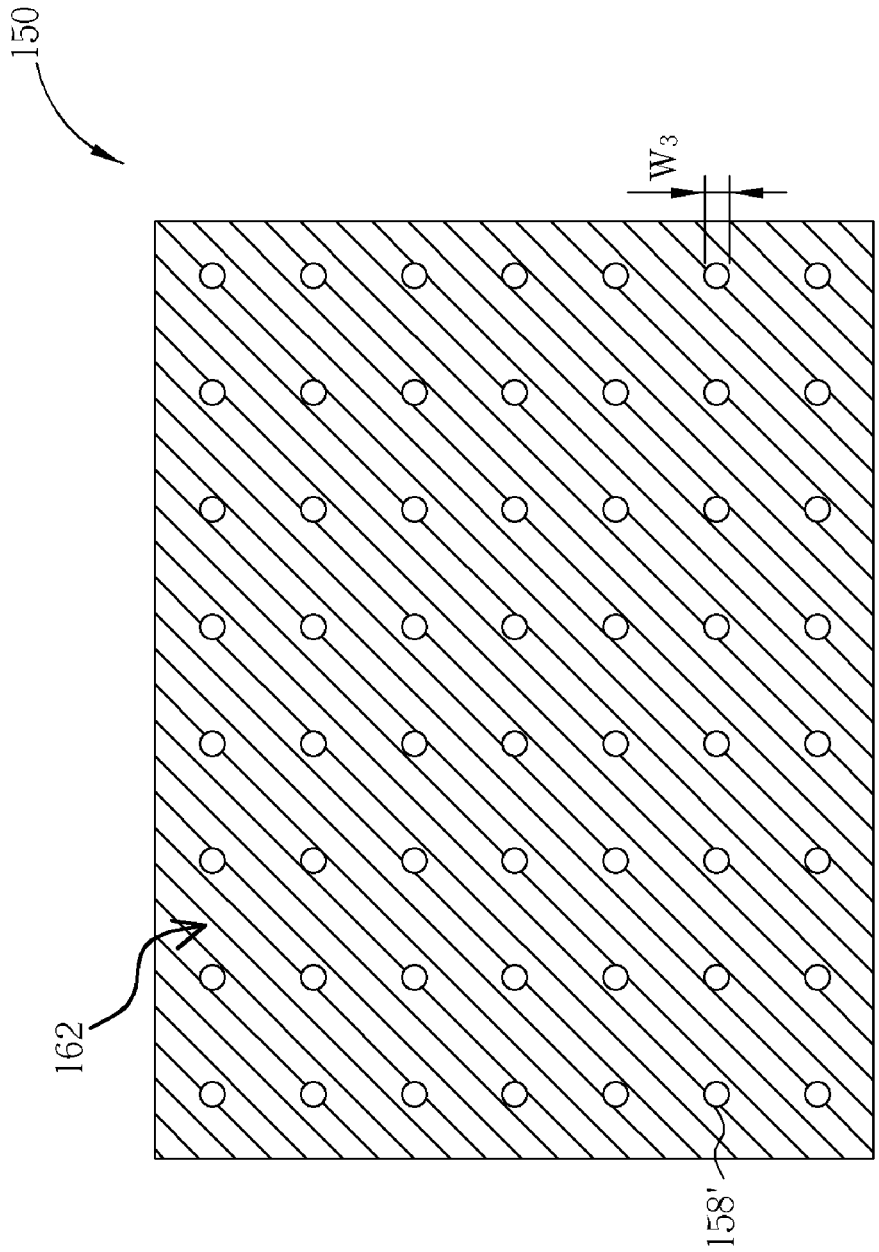
Figure 32:
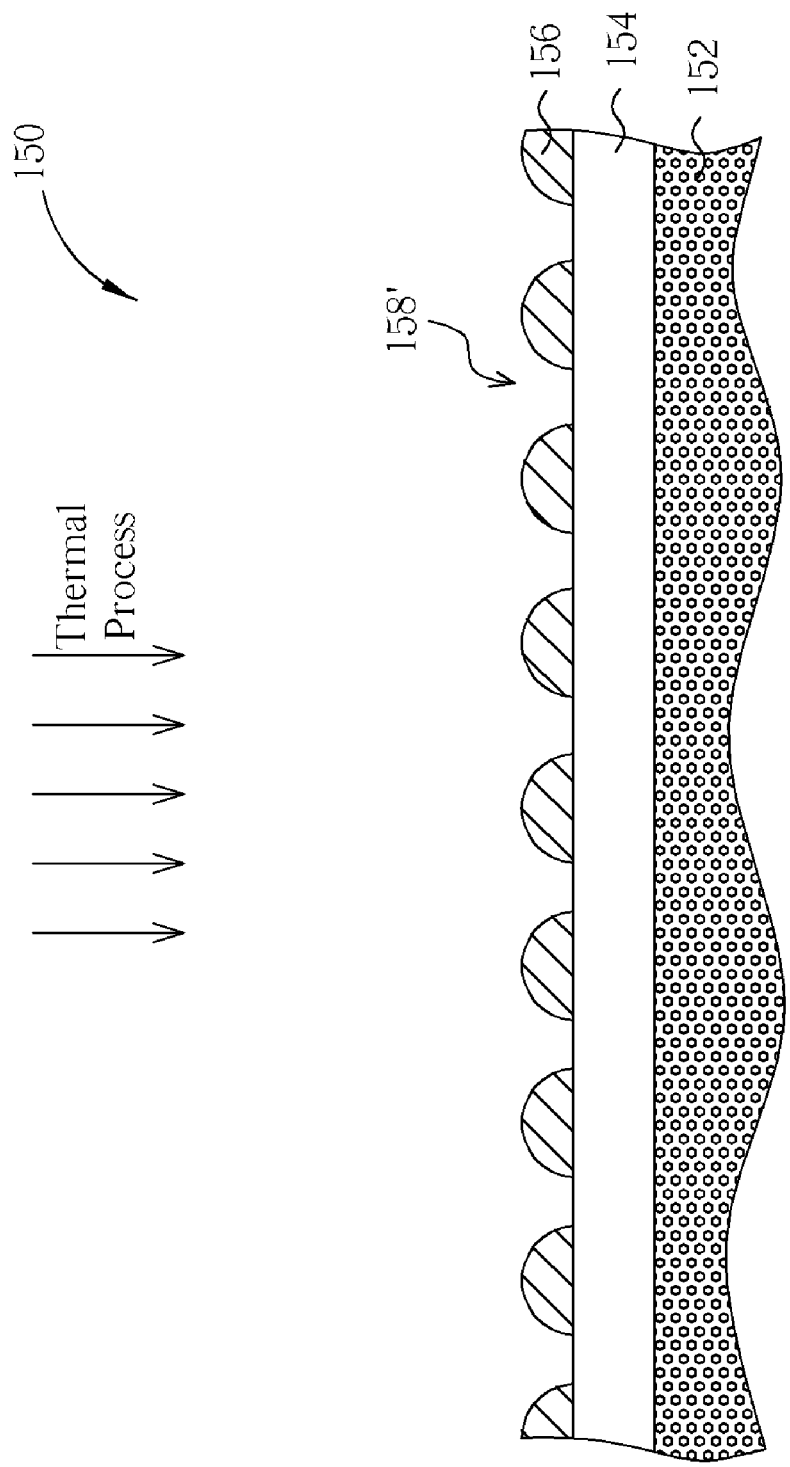

Please refer to FIG. 31 and FIG. 32. Next, a thermal process, such as a reflow process, is performed on the wafer 150 to expand the patterns on the first photoresist layer uniformly and shrink the lithography pattern 158. Then, a lithography pattern 158' which is shrinked is formed. As shown in FIG. 31, after the thermal process, the lithography pattern 158' on the first photoresist layer 156 is still disposed in an array 162, and has a smaller width $W_3$. In this embodiment, lithography equipment can be used optionally to perform a 60- to 90-second thermal process on the wafer 150. Then, the first photoresist layer 156 is used as hard mask. Following that, a lithography process is performed on the hard mask layer 154, and the lithography pattern 158' is transferred to the hard mask layer 154 to form a pattern of contact holes 160 (shown in FIG. 34) disposed in an array. Therefore, the hard mask layer 154 having the patterns of the contact holes can be taken as the first patterned hard mask layer. Then the first photoresist layer 156 is removed, and a BARC 164 and a second photoresist layer 166 are formed in order on the hard mask layer 154.

Figure 33:
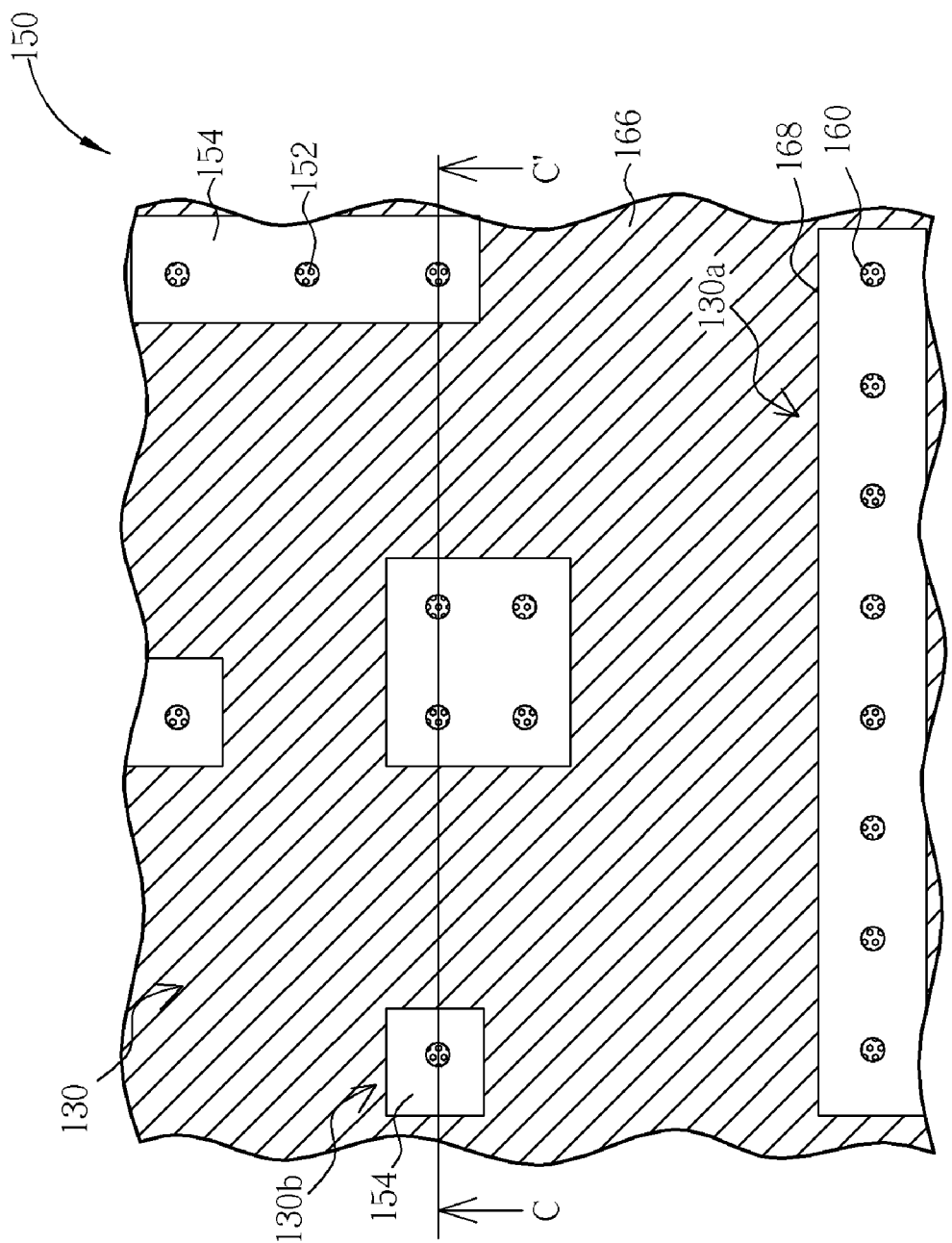
Figure 34:
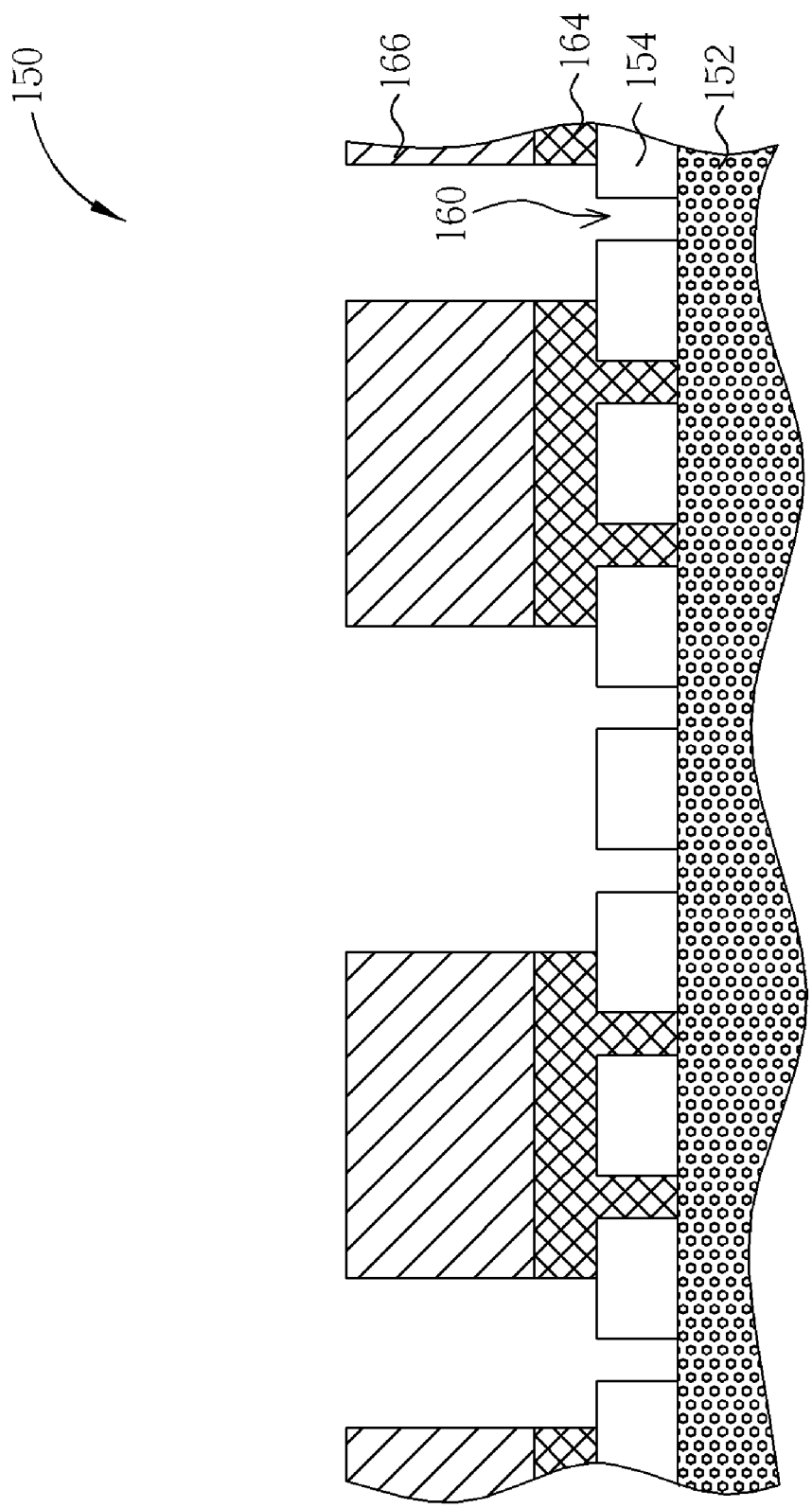

Next, please refer to FIG. 33 to FIG. 34. FIG. 33 is a top view of the wafer 150, and FIG. 34 is a cross-section of the wafer 150 in FIG. 33 along CC'. A second lithography pattern 130 is defined on the second photoresist layer 166. The second lithography pattern 130 comprises a first pattern region 130a and a second pattern region 130b corresponding to the dense pattern region 102 and the iso pattern region 104, respectively, on the circuit pattern 100. Then, a development process is performed. Following that, part of the BARC 164 is removed, so the hard mask layer 154 for forming contact holes is exposed. Now, the second photoresist layer 166 after development and the BARC 164, which exposes the circuit pattern 100 on the hard mask layer 154, are taken as the second patterned hard mask layer in this embodiment. Finally, the hard mask layer 154 is utilized as a mask for performing an etch process on the substrate 152, so the circuit pattern 100 can be formed on the substrate 152.

Figure 35:
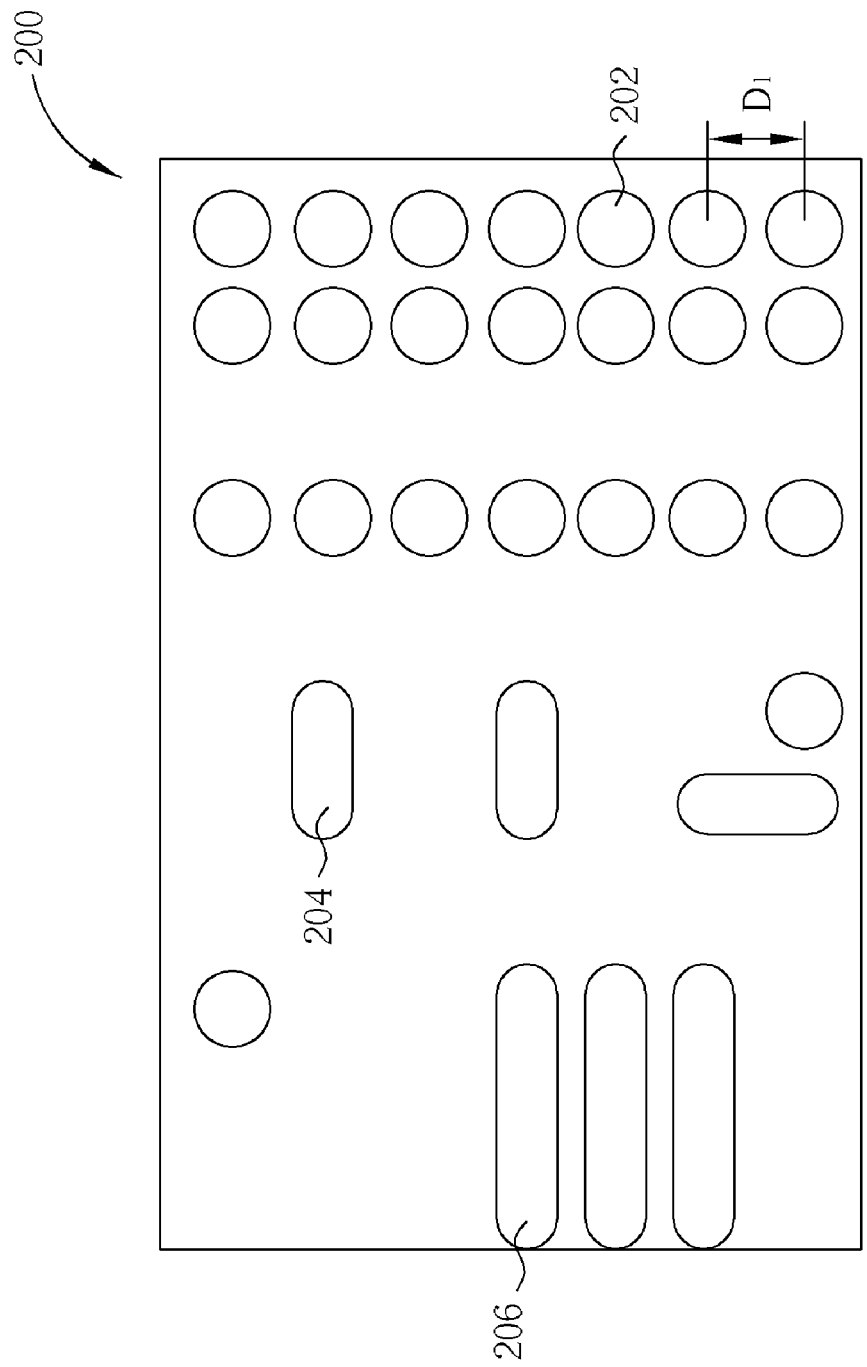
Figure 36:
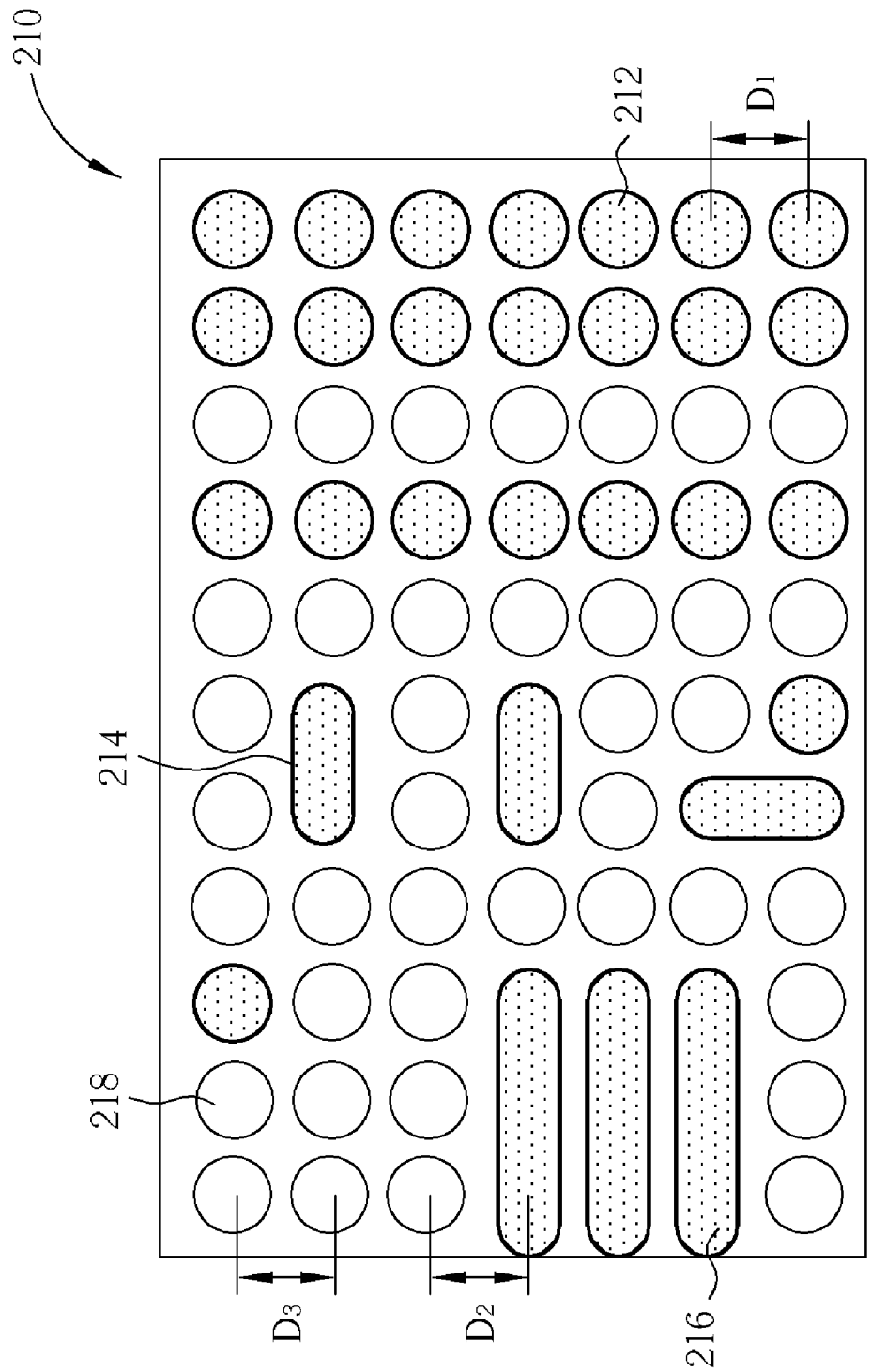

FIG. 35 to FIG. 37 are schematic views of a fabricating process in a fifth embodiment of the present invention. In this embodiment, the circuit pattern 200 should be transferred to a wafer. The circuit pattern 200 comprises a plurality of patterns having random pitch, e.g. patterns of the contact holes 202, dual patterns of the contact holes 204, triple patterns of the contact holes 206, or linear patterns. In order to increase the process window of the patterns having different pitch and shape, based on the principle of the present invention, a hard mask layer and a first photoresist layer are formed on the wafer. Then, a first lithography pattern 210 is provided, which comprises the patterns corresponding to the circuit pattern 200 (indicated by a dotted pattern), e.g. lithography patterns of the contact holes 212, dual lithography patterns of the contact holes 214, and triple lithography patterns of the contact holes 216 corresponding to patterns of the contact holes 202, dual patterns of the contact holes 204, and triple patterns of the contact holes 206. In addition, the first lithography pattern 210 further comprises a plurality of dummy patterns 210 positioned between the lithography patterns of the contact holes 212, dual lithography patterns of the contact holes 214, and triple lithography patterns of the contact holes 216, and the pitch between each pattern is substantially identical. For example, the pitch D3 between the dummy patterns 218, the pitch D2 between the dummy patterns and the triple lithography patterns of the contact holes 216, and the pitch D1 between patterns of the contact holes 212 are identical, so that the first lithography pattern forms an array-like pattern.

Then, the first lithography pattern 210 is transferred to the hard mask layer and the first photoresist layer, so the hard mask layer forms a first patterned hard mask layer. After removing the photoresist layer, a BARC and a second photoresist layer are optionally formed on the first patterned hard mask layer. Next, as shown in FIG. 37, a second lithography pattern 220 comprising a plurality of the selecting patterns 222 corresponding to each patterned region (shown in dotted lines in the selecting patterns) in the circuit pattern 200 is provided. Then, the second lithography pattern 220 is transferred to the second photoresist layer. After the development and etch process, the first patterned hard mask layer corresponding to the circuit pattern 200 is exposed, and the second photoresist layer (and the BARC) forms a second patterned hard mask layer. Finally, the first patterned hard mask layer is utilized as an etch mask to perform an etch process. Thus, the circuit pattern 200 can be transferred to the wafer.

As described above, the method of pattern transfer disclosed in the present invention increases the resolution in the lithography process by using two patterned hard masks (or two exposure processes) to transfer patterns with random pitch to the wafer. First, the method of forming the first patterned hard mask layer is to transfer the first lithography pattern with array or array-like patterns to the first photoresist layer. Because each of the first lithography patterns has substantially identical pitch, the resolution or the exposure condition can be controlled properly so the process window can be increased. Next, the array pattern after development on the first photoresist layer is transferred to the hard mask to form the first patterned hard mask layer. After the first photoresist is removed, a second photoresist layer is formed on the first patterned hard mask layer. Then, the patterns or regions required in the array pattern are chosen to design a second lithography pattern. Then, the second lithography pattern is transferred to the second photoresist layer to form the second patterned hard mask layer, and part of the first patterned hard mask layer having selecting patterns is exposed. Following that, the first patterned hard mask layer is utilized as a mask to perform an etch process to finish pattern transfer. The array pattern comprising target patterns is formed on the hard mask layer having a better anti-etching property. Therefore, the patterns on the hard mask are not damaged in subsequent processes, such as forming the second photoresist layer or performing the second pattern transfer process. In addition, the hard mask having the first lithography pattern can be used as an etch mask when etching the target substrate, so the patterns can be transferred to the substrate completely.

Compared to the prior art, the patterns with equal pitch are lithographed and transferred to the hard mask layer in the present invention. Therefore, the deviation of the dense/iso pattern caused by random pitch in the prior art can be prevented, and the expose latitude can be increased. By using ArF as a light source in the first lithography process, exposed patterns with high resolution can be obtained, and particularly, the resolution of smaller-sized contact holes can be increased obviously. Furthermore, because the second lithography process defines the required circuit pattern by regions, demands on the resolution are not as strict as in the first pattern transfer process. So, a light source with low cost, such as KrF, can be used. Compared to ArF, the fabricating conditions and the material of KrF photoresist are less strict than ArF, and the load of the ArF equipment is not increased, because KrF is used as the light source. So, the total cost of the fabricating process is reduced. In addition, the method disclosed in the present invention can omit complicated OPC processes, such as adding SRAF elements to the layout of the photo mask in the traditional process, and a high process window can still be obtained.

Those skilled in the art will readily observe that numerous modifications and alterations of the device and method may be made while retaining the teachings of the invention.

What is claimed is:

1. A method of pattern transfer comprising:
    providing a substrate;
    forming a first patterned hard mask layer on the substrate and the first patterned hard mask layer comprising a circuit pattern and a plurality of dummy patterns;
    forming a second patterned hard mask layer on the substrate to expose the circuit pattern on the first patterned hard mask layer; and
    partially removing the substrate by using the first patterned hard mask layer as a mask for transferring the circuit pattern to the substrate.

2. The method of claim 1, wherein the dummy patterns and the circuit pattern form an array pattern.

3. The method of claim 1, wherein the pitch of the dummy patterns and the pitch of the circuit pattern are identical.

4. The method of claim 1, wherein the circuit pattern comprises:
a dense pattern region comprising a plurality of dense patterns; and
an iso pattern region comprising at least an iso pattern,
wherein the first patterned hard mask layer comprises the dense patterns, the iso pattern and the dummy patterns, and the second patterned hard mask layer comprises a first pattern region corresponding to the dense pattern region and a second pattern region corresponding to the iso pattern region.

5. The method of claim 3, wherein the circuit pattern comprises:
a dense pattern region comprising a plurality of dense patterns; and
an iso pattern region comprising at least an iso pattern,
wherein the first patterned hard mask layer comprises the dense patterns, the iso pattern and the dummy patterns, and the second patterned hard mask layer comprises a first pattern region corresponding to the dense pattern region and a second pattern region corresponding to the iso pattern region.

6. The method of claim 4, wherein the dense patterns and the iso pattern are patterns of contact holes.

7. The method of claim 6, wherein the size of the dense patterns and the size of the iso pattern are different.

8. The method of claim 6, wherein the shape of the dense patterns and the shape of the iso pattern are identical.

9. The method of claim 4, wherein the first pattern region and the second pattern region in the second patterned hard mask layer expose the dense patterns and the iso pattern in the first patterned hard mask layer and cover the dummy patterns in the first patterned hard mask layer.

10. The method of claim 5, wherein the first pattern region and the second pattern region in the second patterned hard mask layer expose the dense patterns and the iso pattern in the first patterned hard mask layer and cover the dummy patterns in the first patterned hard mask layer.

11. The method of claim 6, wherein the first pattern region and the second pattern region in the second patterned hard mask layer expose the dense patterns and the iso pattern in the first patterned hard mask layer and cover the dummy patterns in the first patterned hard mask layer.

12. The method of claim 1, wherein the steps of forming the first patterned hard mask layer comprise:
forming a hard mask layer and a first photoresist layer on the surface of the substrate; and
performing a lithography process to define a pattern of the first hard mask layer.

13. The method of claim 12, wherein the method of forming the first patterned hard mask layer further comprises:
forming the pattern of the first patterned hard mask layer comprising the circuit pattern and the dummy patterns on the first photo resist layer by a development process; and
performing an etch process to remove the hard mask layer exposed partly by the first photoresist layer by using the first photoresist layer as a mask.

14. The method of claim 12 further comprising performing a thermal process to shrink the circuit pattern and the dummy patterns in the first photoresist layer by an identical ratio.

15. The method of claim 14, wherein the thermal process is a reflow process.

16. The method of claim 12, wherein the light source of the lithography process is Argon Fluoride (ArF).

17. The method of claim 1, wherein the method of forming the second patterned hard mask layer comprises:
forming a second photoresist layer in the first patterned hard mask layer; and
performing a lithography process to pattern the second photoresist layer to form the second patterned hard mask layer.

18. The method of claim 17 further comprising:
forming a bottom anti-reflective coating (BARC) layer before forming the second patterned hard mask layer.

19. The method of claim 18 further comprising:
performing an etch process to remove a part of the BARC layer exposed by the second patterned hard mask layer by using the anti-reflective coating as a hard mask.

20. The method of claim 18, wherein the BARC layer is a developable anti-reflective coating, and the step of forming the second patterned hard mask layer further comprises performing a development process to form the pattern of the second patterned hard mask layer in the second photoresist layer and the BARC layer,
wherein the etch process is a reactive ion etch (RIE) process and
the light source of the lithography process is Krypton Fluoride (KrF).

* * * * *